(12) United States Patent
Nakatani et al.

(10) Patent No.: US 7,109,793 B2
(45) Date of Patent: Sep. 19, 2006

(54) HIGH FREQUENCY DIFFERENTIAL CIRCUIT, DIFFERENTIAL AMPLIFIER, DIFFERENTIAL MIXER, DIFFERENTIAL OSCILLATOR, AND RADIO CIRCUIT USING SAME

(75) Inventors: Toshifumi Nakatani, Sakai (JP); Hisashi Adachi, Mino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 81 days.

(21) Appl. No.: 10/848,212

(22) Filed: May 19, 2004

(65) Prior Publication Data

US 2004/0232988 A1 Nov. 25, 2004

(30) Foreign Application Priority Data

May 22, 2003 (JP) ............................. 2003-145127

(51) Int. Cl.
*H03F 3/45* (2006.01)
(52) U.S. Cl. .......................................... 330/252; 330/69
(58) Field of Classification Search ................ 330/252, 330/69, 54, 58, 59, 60; 327/359
See application file for complete search history.

(56) References Cited

U.S. PATENT DOCUMENTS

| | | | |
|---|---|---|---|
| 5,606,288 A | * | 2/1997 | Prentice ...................... 330/260 |
| 5,812,942 A | | 9/1998 | Allen et al. |
| 6,046,639 A | | 4/2000 | Kudo |
| 6,100,758 A | | 8/2000 | Klemmer |
| 6,255,889 B1 | | 7/2001 | Branson |
| 6,259,312 B1 | * | 7/2001 | Murtojarvi .................. 327/563 |
| 6,396,330 B1 | | 5/2002 | Fujii |
| 6,404,263 B1 | | 6/2002 | Wang |
| 6,741,129 B1 | * | 5/2004 | Corsi et al. ................. 330/252 |

FOREIGN PATENT DOCUMENTS

| | | |
|---|---|---|
| EP | 0 689 283 | 12/1995 |
| EP | 0 744 829 | 11/1996 |
| JP | 2002-009589 | 1/2002 |

OTHER PUBLICATIONS

Takeshi Yasunaga et al., "A Fully Integrated PLL Frequency Synthesizer LSI For Mobil Communication System", 2001 IEEE Radio Frequency Integrated Circuits Symposium, IEEE Service Center, U.S.A., vol. 1, May 20, 2001, pp. 65-68.

Durdodt et al., Institute of Electrical and Electronics Engineers: "The First Very Low-IF RX, 2-Point Modulation TX CMOS System on Chip Bluetooth Solution", 2001 IEEE Radio Frequency Integrated Circuits (RFIC) Symposium. Digest of Papers. Phoenix, AZ, May 20-22, 2001, pp. 99-102, XP010551330.

(Continued)

*Primary Examiner*—Henry Choe
(74) *Attorney, Agent, or Firm*—Wenderoth, Lind & Ponack, L.L.P.

(57) ABSTRACT

In order to enhance a reverse isolation characteristic of a differential amplifier, which is used as, for example, an RE amplifier or a local amplifier of a mobile telephone, differential amplifier is provided which includes a differential amplification circuit for amplifying a difference in potential between two input signals in reverse phase with each other, which are inputted into Port1 and Port2, and for outputting two output signals in reverse phase with each other from Port3 and Port4; a feedback capacitor connected between Port and Port4; and a feedback capacitor connected between Port2 and Port3. Signals for canceling feedback signals are inputted into input terminals via the feedback capacitors, whereby it is possible to the reverse isolation characteristic of the differential amplifier.

27 Claims, 15 Drawing Sheets

OTHER PUBLICATIONS

Cassan et al., "A 1-V Transformer-Feedback Low Noise Amplifier for 5-GHz Wireless LAN in 0.18-MUM CMOS", IEEE Journal of Solid-State Circuits, IEEE Service Center, Piscataway, NJ, US, vol. 38, No. 3, Mar. 2003, pp. 427-435, XP001158083.

Kim et al: "A SI BICMOS Transimpedance Amplifier for 10-GB/S Sonet Receiver", IEEE Journal of Solid-State Circuits, IEEE Service Center, Piscataway, NJ, US, vol. 38, No. 5, May 2001, pp. 769-776, XP001222690.

Muellrich et al: "High-Gain Transimpedance Amplifier in INP-Based HBT Technology for the Receiver in 40-GB/S Optical-Fiber TDM Links", IEEE Journal of Solid-State Circuits, IEEE Service Center, Piscataway, NJ, US, vol. 35, No. 9, Sep. 2000, pp. 1260-1265, XP 001132154.

* cited by examiner

CAPACITANCE VALUE OF FEEDBACK CAPACITOR (pF)

F I G. 1 8
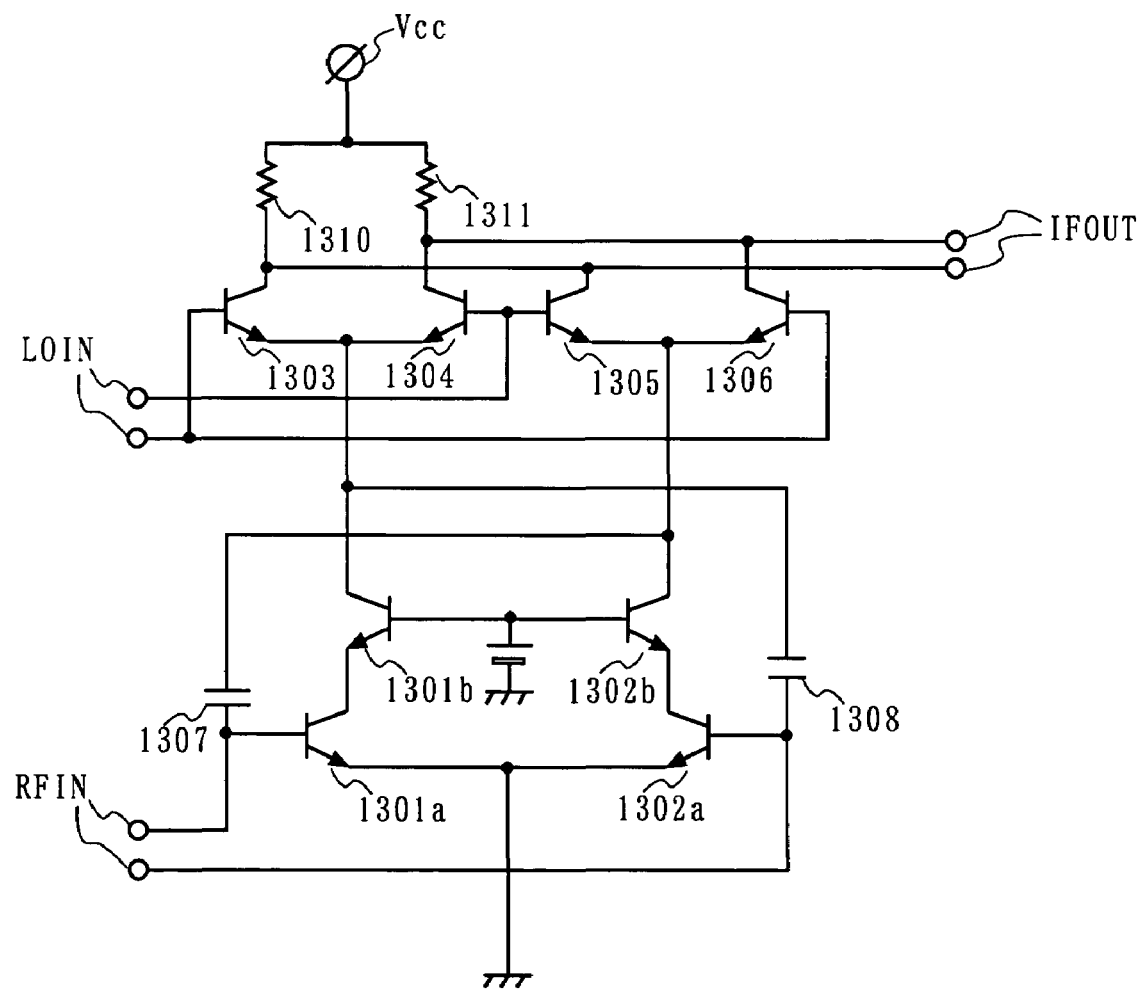

HIGH FREQUENCY DIFFERENTIAL CIRCUIT, DIFFERENTIAL AMPLIFIER, DIFFERENTIAL MIXER, DIFFERENTIAL OSCILLATOR, AND RADIO CIRCUIT USING SAME

BACKGROUND OF THE INVENTION

1. Field of the Invention

The present invention relates to a high frequency circuit, an amplifier, a mixer, an oscillator, and a radio circuit using them, and more particularly to a high frequency differential circuit, a differential amplifier, a differential mixer, a differential oscillator, and a radio circuit using them.

2. Description of the Background Art

In a differential amplifier for use in a high frequency circuit, it is necessary to enhance its reverse isolation characteristic in order not to reduce a power amplification factor. Enhancing a reverse isolation as used herein means to suppress a so-called negative feedback effect of a signal fed back from an output to an input which reduces the level of an input signal. Conventionally, configuring a differential amplifier with a cascode amplifier is known to be effective in enhancing the reverse isolation characteristic (see Takeshi Yasunaga et al., "A Fully Integrated PLL Frequency Synthesizer LSI For Mobile Communication System", 2001 IEEE Radio Frequency Integrated Circuit Symposium, IEEE Service Center, USA, May 20, 2001, vol. 1, pp. 65–68).

FIG. 21 is a circuit diagram of a conventional differential amplifier including cascode amplifiers. In FIG. 21, the differential amplifier includes transistors 91a and 91b, transistors 92a and 92b, a resistor 93, load resistors 94a and 94b, a constant-current supply 95, a positive supply 96, a ground 97, and a bias supply 98.

The transistors 91a and 91b constitutes a differential pair for amplification. Signals in reverse phase with each other are inputted into bases of the transistors 91a and 91b.

An emitter of the transistor 92a is connected to a collector of the transistor 91a, thereby forming a cascode amplifier. Similarly, an emitter of the transistor 92b is connected to a collector of the transistor 91b, thereby forming a cascode amplifier.

The resistor 93 is connected between emitters of the transistors 91a and 91b. The constant-current supply 95 is connected between a tap of the resistor 93 and the ground 97.

Bases of the transistors 92a and 92b are connected together. The bias supply 98 is connected between the bases of the transistors 92a and 92b in order to supply a constant bias.

A collector of the transistor 92a is connected to one end of the load resistor 94a. Similarly, a collector of the transistor 92b is connected to one end of the load resistor 94b. The positive supply 96 is connected to the other ends of the load resistors 94a and 94b. Connected between the transistor 92a and the load resistor 94a is an output terminal 99a. Connected between the transistor 92b and the load resistor 94b is an output terminal 99b. Signals in reverse phase with each other are outputted from the output terminals 99a and 99b.

The transistors 92a and 92b reduce variation of collector voltages of the transistors 91a and 91b, which constitute a differential pair for amplification, due to a signal current. Accordingly, it is possible to minimize the miller effect of the transistors 91a and 91b, thereby enhancing the reverse isolation characteristic of the differential amplifier.

As described above, by providing cascode amplifiers in a differential amplifier, it is made possible to enhance the reverse isolation characteristic of the differential amplifier, whereby it is possible to prevent gain from decreasing in a high frequency region.

However, even in the differential amplifier including the cascode amplifiers, the reverse isolation characteristic thereof is reduced in a frequency region above 100 MHz mainly due to a parasitic capacitance present between input and output ends.

For example, in the case of a differential amplifier included in a mobile telephone as an RF amplifier connected between an antenna and a mixer, if the reverse isolation characteristic of the RF amplifier is reduced, a signal derived from the mixer leaks into the antenna side via the RF amplifier. Also, in the case of a differential amplifier used as a local amplifier connected between a local oscillator and a mixer, if the reverse isolation characteristic of the local amplifier is reduced, a signal derived from the mixer leaks into the local oscillator via the local amplifier, deteriorating a noise characteristic of the local oscillator.

Accordingly, there is no satisfactory conventional differential amplifier in terms of the reverse isolation characteristic in a high frequency region.

The problem as described above is not limited to the differential amplifier, and also occurs in high frequency differential circuits, such as a differential mixer, a differential oscillator, etc., which include the differential amplifier.

SUMMARY OF THE INVENTION

Therefore, an object of the present invention is to provide a high frequency differential circuit capable of maintaining a satisfactory reverse isolation characteristic even in a high frequency region.

Another object of the present invention is to provide a differential amplifier, a differential mixer, and a differential oscillator which are realized by the same high frequency differential circuit.

Still another object of the present invention is to provide a radio circuit having incorporated therein the differential amplifier, the differential mixer, and the differential oscillator which are realized by the same high frequency differential circuit.

The present invention has the following features to attain the object mentioned above.

A first aspect of the present invention is directed to a high frequency differential circuit which operates in accordance with a difference in potential between two signals, and the circuit includes: a differential amplification circuit for amplifying a difference in potential between two input signals in reverse phase with each other, which are inputted into first and second input ends, and for outputting two output signals in reverse phase with each other from first and second output ends; a first passive element circuit connected between the first input end and the second output end; and a second passive element circuit connected between the second input end and the first output end.

In the first aspect, a signal in reverse phase with a feedback signal, which is fed back from the output side to the input side of the differential circuit due to a parasitic capacitance present between an output and an input of a transistor, is inputted into an input terminal of the differential circuit, thereby canceling the feedback signal. Accordingly, it is possible to enhance a reverse isolation characteristic.

For example, the high frequency differential circuit may be a differential amplifier.

Preferably, the differential amplification circuit may include two cascode amplifiers.

Thus, the reverse isolation characteristic is further enhanced by the cascode amplifiers.

Preferably, the first and second passive element circuits may be capacitors.

Thus, the capacitors are used as the first and second passive element circuits, whereby it is possible to enhance the reverse isolation characteristic in a particular frequency band.

Preferably, a capacitance of each capacitor may be set so as to transfer a positive phase signal having a sufficient intensity to cancel a feedback signal which occurs due to a parasitic capacitance present between an input and an output of a transistor included in the differential amplification circuit.

Thus, it is possible to cancel the feedback signal.

Preferably, the capacitance of each capacitor may be equivalent to the parasitic capacitance present between the input and output of the transistor included in the differential amplification circuit.

Thus, a positive phase signal having a sufficient intensity to cancel a feedback signal, which occurs due to a parasitic capacitance present between the input and output of the transistor included in the differential amplification circuit, is transferred to the input terminal side, thereby canceling the feedback signal.

Preferably, the first passive element circuit may be equivalent to an equivalent circuit formed by parasitic components present between the first input end and the first output end, and the second passive element circuit may be equivalent to an equivalent circuit formed by parasitic components present between the second input end and the second output end.

Thus, the first and second passive element circuits each are equivalent to an equivalent circuit formed by parasitic components, and therefore over a wide range of frequency bands, it is possible to input a signal for canceling the feed back signal to the input terminal, whereby it is possible to enhance the reverse isolation characteristic over a wide range of frequency bands.

Preferably, the first passive element circuit may be equivalent to a portion of an equivalent circuit formed by parasitic components present between the first input end and the first output end, and the second passive element circuit may be equivalent to a portion of an equivalent circuit formed by parasitic components present between the second input end and the second output end.

Thus, the first and second passive element circuits each are equivalent to a portion of an equivalent circuit formed by parasitic components, and therefore over a wide range of frequency bands, it is possible to input a signal for canceling the feed back signal to the input terminal, whereby it is possible to enhance the reverse isolation characteristic over a wide range of frequency bands.

Preferably, the high frequency differential circuit may further include a third passive element circuit connected between the first and second passive element circuits.

Preferably, in comparison with an impedance between an input and an output of the high frequency differential circuit, an impedance of the third passive element circuit may be high in a predetermined frequency band and low in other frequency bands.

Thus, the third passive element circuit has substantially an open impedance in a specific frequency band, while substantially having a short impedance in other frequency bands. Accordingly, in frequency bands other than a frequency band in which the reverse isolation characteristic is desired to be enhanced, no signal is fed back via the first and second passive element circuits, whereby it is possible to prevent abnormal oscillation from occurring due to a positive feedback.

Preferably, the third passive element circuit may be a parallel circuit in which an inductor and a capacitor are connected in parallel.

Thus, it is possible to configure the third passive element circuit so as to have substantially an open impedance in a specific frequency band, while substantially having a short impedance in other frequency bands. Accordingly, in frequency bands other than a frequency band in which the reverse isolation characteristic is desired to be enhanced, no signal is fed back via the first and second passive element circuits, whereby it is possible to prevent abnormal oscillation from occurring due to a positive feedback.

For example, the differential amplification circuit includes first, second, third, and fourth transistors, wherein an emitter of the first transistor is connected to an emitter of the second transistor, a collector of the first transistor is connected to an emitter of the third transistor, a base of the third transistor is connected to a base of the fourth transistor, a collector of the second transistor is connected to an emitter of the fourth transistor, the first passive element circuit includes a first capacitor provided between a base of the first transistor and a collector of the fourth transistor, and the second passive element circuit includes a second capacitor provided between a base of the second transistor and a collector of the third transistor.

Alternatively, the differential amplification circuit includes first and second transistors, wherein a base of the first transistor is connected to a base of the second transistor, the first passive element circuit includes a first capacitor provided between an emitter of the first transistor and a collector of the second transistor, and the second passive element circuit includes a second capacitor provided between an emitter of the second transistor and a collector of the first transistor.

Further, the high frequency differential circuit may further include: a first pair of transistors having their emitters connected to the first output end of the differential amplification circuit; and a second pair of transistors having their emitters connected to the second output end of the differential amplification circuit, and the high frequency differential circuit may operate as a differential mixer.

Thus, it is possible to provide a differential mixer having an enhanced reverse isolation characteristic.

For example, in the case of operating the high frequency differential circuit as a differential mixer, the differential amplification circuit includes first and second transistors having their emitters connected together, the first pair of transistors is made by third and fourth transistors having their emitters connected together, the second pair of transistors is made by fifth and sixth transistors having their emitters connected together, a collector of the first transistor is connected to the emitters of the third and fourth transistors, a collector of the second transistor is connected to the emitters of the fifth and sixth transistors, bases of the third and sixth transistors are connected together, bases of the fourth and fifth transistors are connected together, collectors of the third and fifth transistors are connected together, collectors of the fourth and sixth transistors are connected together, the first passive element circuit includes a first capacitor provided between the collector of the first transistor and a base of the second transistor, and the second passive element circuit includes a second capacitor provided between the collector of the second transistor and a base of the first transistor.

Alternatively, in the case of operating the high frequency differential circuit as a differential mixer, the differential amplification circuit includes first, second, third, and fourth transistors, the first pair of transistors is made by fifth and sixth transistors having their emitters connected together, the second pair of transistors is made by seventh and eighth transistors having their emitters connected together, the emitter of the first transistor is connected to the emitter of the second transistor, a collector of the first transistor is connected to an emitter of the third transistor, a base of the third transistor is connected to a base of the fourth transistor, a collector of the second transistor is connected to an emitter of the fourth transistor, a collector of the third transistor is connected to the emitters of the fifth and sixth transistors, a collector of the fourth transistor is connected to the emitters of the seventh and eighth transistors, bases of the fifth and eighth transistors are connected together, bases of the sixth and seventh transistors are connected together, collectors of the fifth and seventh transistors are connected together, collectors of the sixth and eighth transistors are connected together, the first passive element circuit includes a first capacitor provided between a base of the first transistor and the collector of the fourth transistor, and the second passive element circuit includes a second capacitor provided between a base of the second transistor and the collector of the third transistor.

Further, the high frequency differential circuit may further include a differential oscillation circuit connected between the first and second input ends of the differential amplification circuit, wherein the differential oscillation circuit may be connected to the first input end via a first capacitor and to the second input end via a second capacitor, and the high frequency differential circuit may operate as a differential oscillator.

Thus, it is possible to provide a differential oscillator having an enhanced reverse isolation characteristic.

For example, in the case of operating the high frequency differential circuit as a differential oscillator, the differential amplification circuit includes first and second transistors having their emitters connected together, the differential oscillation circuit includes a first FET, a second FET, a third capacitor, a fourth capacitor, a first inductor, and a second inductor, a drain of the first FET is connected to a gate of the second FET, a drain of the second FET is connected to a gate of the first FET, the second and third capacitors are connected in series between the drains of the first and second FETs, the first and second inductors are connected in series between the drains of the first and second FETs, the drain of the first FET is connected to a base of the first transistor via the first capacitor, the drain of the second FET is connected to a base of the second transistor via the second capacitor, the first passive element circuit includes a fifth capacitor provided between a collector of the first transistor and the base of the second transistor, and the second passive element circuit includes a sixth capacitor provided between a collector of the second transistor and the base of the first transistor.

Alternatively, in the case of operating the high frequency differential circuit as a differential oscillator, the differential amplification circuit includes first, second, third, and fourth transistors, the differential oscillation circuit includes a first FET, a second FET, a third capacitor, a fourth capacitor, a first inductor, and a second inductor, a drain of the first FET is connected to a gate of the second FET, a drain of the second FET is connected to a gate of the first FET, the second and third capacitors are connected in series between the drains of the first and second FETs, the first and second inductors are connected in series between the drains of the first and second FETs, the drain of the first FET is connected to a base of the first transistor via the first capacitor, the drain of the second FET is connected to a base of the second transistor via the second capacitor, an emitter of the first transistor is connected to an emitter of the second transistor, a collector of the first transistor is connected to an emitter of the third transistor, a base of the third transistor is connected to a base of the fourth transistor, a collector of the second transistor is connected to an emitter of the fourth transistor, the first passive element circuit includes a fifth capacitor provided between the base of the first transistor and a collector of the fourth transistor, and the second passive element circuit includes a sixth capacitor provided between the base of the second transistor and a collector of the third transistor.

A second aspect of the present invention is directed to a radio circuit for transmitting and receiving a radio signal, which includes an amplifier, a mixer, and an oscillator, and at least one of the amplifier, the mixer, and the oscillator includes a high frequency differential circuit that includes: a differential amplification circuit for amplifying a difference in potential between two input signals in reverse phase with each other, which are inputted into first and second input ends, and for outputting two output signals in reverse phase with each other from first and second output ends; a first passive element circuit connected between the first input end and the second output end; and a second passive element circuit connected between the second input end and the first output end.

For example, the amplifier amplifies a reception signal received by an antenna, the oscillator oscillates a local signal, the mixer uses the local signal outputted from the oscillator to downconvert the reception signal amplified by the amplifier, and the amplifier includes the high frequency differential circuit.

Thus, it is possible to prevent a local signal from leaking into the antenna side.

For example, the oscillator oscillates a local signal, the amplifier amplifies the local signal outputted from the oscillator, the mixer uses the local signal amplified by the amplifier to downconvert a reception signal received by an antenna, and the amplifier includes the high frequency differential circuit.

Thus, it is possible to prevent a received large input signal from flowing to the oscillator.

For example, the oscillator oscillates a local signal, the amplifier amplifies the local signal outputted from the oscillator, the mixer uses the local signal amplified by the amplifier to upconvert an IF signal, and the amplifier includes the high frequency differential circuit.

Thus, it is possible to prevent a signal reflected within the circuit from flowing to the oscillator.

For example, the oscillator oscillates a local signal, the mixer uses the local signal outputted from the oscillator to upconvert the IF signal into an RF signal, and the amplifier amplifies the RF signal outputted from the mixer, and includes the high frequency differential circuit.

Thus, it is possible to prevent the signal reflected within the circuit from being positively fed back to the amplifier, and causing abnormal oscillation or malfunction of the amplifier.

For example, the amplifier amplifies a reception signal received by an antenna, the oscillator oscillates a local signal, and the mixer uses the local signal outputted from the oscillator to downconvert the reception signal amplified by the amplifier, and includes the high frequency differential circuit.

Alternatively, the amplifier amplifies a reception signal received by an antenna, the oscillator oscillates a local signal, the mixer uses the local signal outputted from the oscillator to downconvert the reception signal amplified by the amplifier, and the oscillator includes the high frequency differential circuit.

Alternatively still, the oscillator oscillates a local signal, the mixer uses the local signal outputted from the oscillator to upconvert an IF signal into an RF signal, the amplifier amplifies the RF signal outputted from the mixer, and the mixer includes the high frequency differential circuit.

Alternatively still, the oscillator oscillates a local signal, the mixer uses the local signal outputted from the oscillator to upconvert an IF signal into an RF signal, the amplifier amplifies the RF signal outputted from the mixer, and the oscillator includes the high frequency differential circuit.

Thus, in the present invention, a signal in reverse phase with a feedback signal, which is fed back from the output side to the input side of the differential circuit due to a parasitic capacitance present between an output and an input of a transistor, is inputted into an input terminal of the differential circuit, thereby canceling the feedback signal. Accordingly, it is possible to provide a differential amplifier, a differential mixer, and a differential oscillator having an enhanced reverse isolation characteristic, and it is also possible to provide a radio circuit having incorporated therein the differential amplifier, the differential mixer, and the differential oscillator having an enhanced reverse isolation characteristic.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram illustrating parasitic capacitances, parasitic resistances, and parasitic inductances, which are present between a base of a transistor 1a and a collector of a transistor 2a;

FIG. 18 is a diagram illustrating a structure of a differential mixer including cascode amplifiers;

DESCRIPTION OF THE PREFERRED EMBODIMENTS (First Embodiment)

Figure 1:
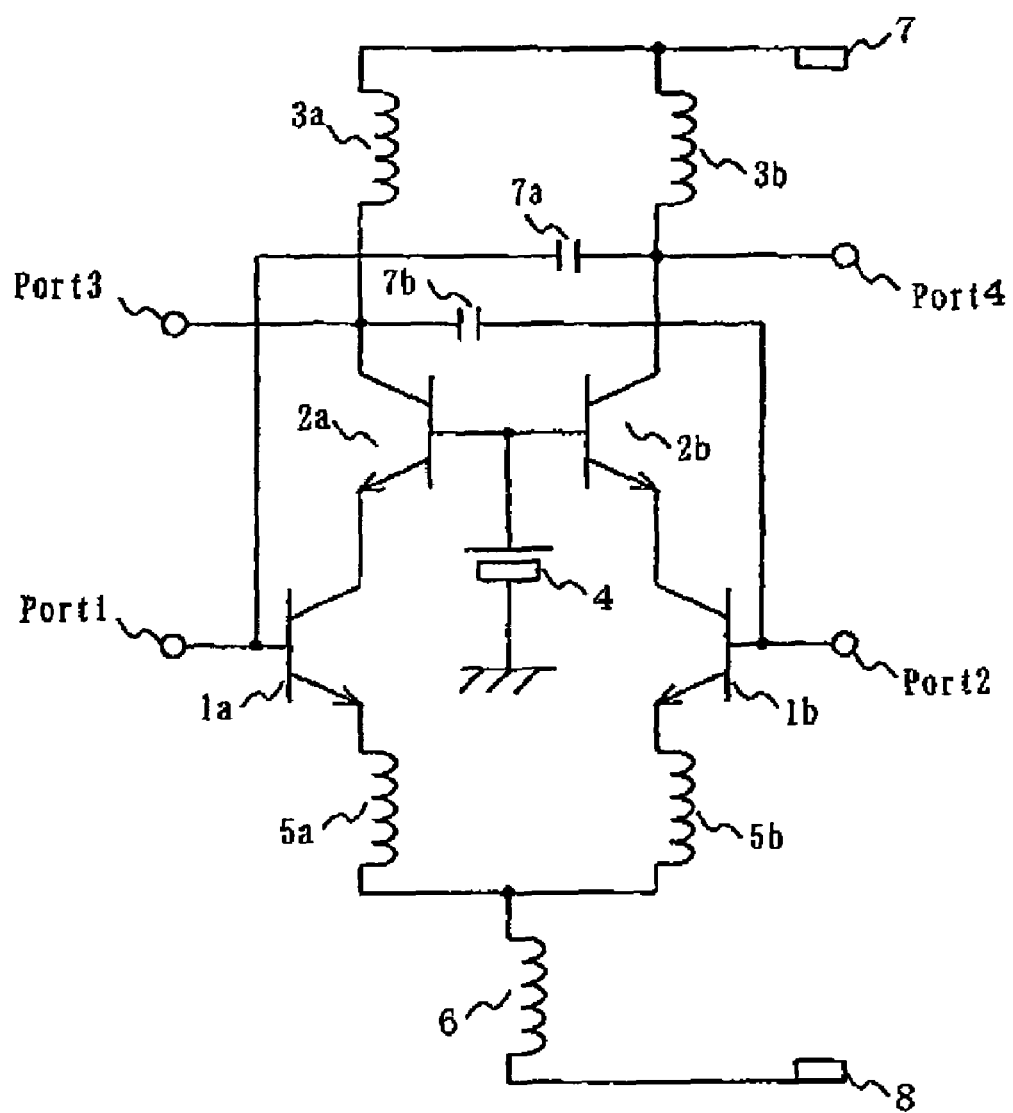
FIG. 1 is a circuit diagram of a cascode-type differential amplifier according to a first embodiment of the present invention.

FIG. 1 is a circuit diagram of a cascode-type differential amplifier according to a first embodiment of the present invention. In FIG. 1, the differential amplifier includes transistors 1a and 1b, transistors 2a and 2b, inductors 3a and 3b, a bias supply 4, inductors 5a and 5b, an inductor 6, a positive supply 7, feedback capacitors 7a and 7b, and a ground 8.

The transistors 1a and 1b constitutes a differential pair for amplification. Signals in reverse phase with each other are inputted into Port1 connected to a base of the transistor 1a, and Port2 connected to a base of the transistor 1b.

An emitter of the transistor 2a is connected to a collector of the transistor 1a, thereby forming a cascode amplifier. Similarly, an emitter of the transistor 2b is connected to a collector of the transistor 1b, thereby forming a cascode amplifier.

The inductors 5a and 5b are connected in series between emitters of the transistors 1a and 1b. One end of the inductor 6 is connected between the inductors 5a and 5b. The other end of the inductor 6 is connected to the ground 8.

Bases of the transistors 2a and 2b are connected together. The bias supply 4 is connected between the bases of the transistors 2a and 2b in order to supply a constant bias.

The inductors 3a and 3b are connected in series between collectors of the transistors 2a and 28. The positive supply 7 is connected between the inductors 3a and 3b. #Connected between the transistor 2a and the inductor 3a is Port3 which is an output terminal. Connected between the transistor 2b and the inductor 3b Port4 which is an output terminal. Signals in reverse phase are outputted from Port3 and Port4.

The feedback capacitor 7b is connected between the base of the transistor 1b and the collector of the transistor 2a. The feedback capacitor 7b has a capacitance value equivalent to a capacitance value of a parasitic capacitance present between an input of the transistor 1b and an output of the transistor 2b. The feedback capacitor 7a is connected between the base of the transistor 1a and the collector of the transistor 2b. The capacitance 7a has a capacitance value equivalent to a capacitance value of a parasitic capacitance present between an input of the transistor 1a and an output of the transistor 2a. Specifically, the capacitance value of the feedback capacitor 7b is set so as to transfer a positive phase signal having a sufficient intensity to cancel a feedback signal which occurs due to the parasitic capacitance present between the input of the transistor 1b and the output of the transistor 2b. The capacitance value of the feedback capacitor 7a is set so as to transfer a positive phase signal having a sufficient intensity to cancel a feedback signal which occurs due to the parasitic capacitance present between the input of the transistor 1a and the output of the transistor 2a.

If a differential input signal is inputted between base electrodes of the transistors 1a and 1b which constitute a differential pair for amplification, the inputted signal is amplified by the transistors 1a, 1b, 2a and 2b. A differential output signal is obtained from between the collectors of the cascode-connected transistors 2a and 2b.

Described next is the reason that the differential amplifier shown in FIG. 1 is effective in enhancing a reverse isolation characteristic.

Firstly, a discussion is provided as to how a signal outputted from an output terminal of the differential amplifier is prevented from returning to the input terminal side. Input signals to the bases of the transistors 1a and 2a are in reverse phase with each other, and therefore output signals from the collectors of the transistors 2a and 2b are also in reverse phase with each other.

A signal inputted into the base of the transistor 1a is amplified and outputted from the collector of the transistor 2a. The signal outputted from the collector of the transistor 2a is fed back to the base of the transistor 1a due to a parasitic capacitance between the input of the transistor 1a and the output of the transistor 2a. On the other hand, a signal outputted from the collector of the transistor 2b is inputted into the base of the transistor 1a via the feedback capacitor 7a. The signal outputted from the collector of the transistor 2a is in reverse phase with the signal outputted from the collector of the transistor 2b, and therefore the signal fed back to the transistor 1a is canceled by the signal inputted into the base of the transistor 1a via the feedback capacitor 7a.

Similarly, a signal inputted into the base of the transistor 1b is amplified and outputted from the collector of the transistor 2b. The signal outputted from the collector of the transistor 2b is fed back to the base of the transistor 1b due to a parasitic capacitance between the input of the transistor 1b and the output of the transistor 2b. On the other hand, a signal outputted from the collector of the transistor 2a is inputted into the base of the transistor 1b via the feedback capacitor 7b. The signal outputted from the collector of the transistor 2a is in reverse phase with the signal outputted from the collector of the transistor 2b, and therefore the signal fed back to the transistor 1b is canceled by the signal inputted into the base of the transistor 1b via the feedback capacitor 7b. In this manner, in the differential amplifier shown in FIG. 1, the signals outputted from the transistors 2a and 2b are inputted into the transistors 1a and 1b, respectively, via a feed back capacitor, and operate so as to cancel feedback signals. Accordingly, it is possible to prevent a signal outputted from an output terminal of the differential amplifier from returning to the input terminal side.

Next, consider a case where external signals are directly applied to output terminals of the differential amplifier. A radio circuit having the differential amplifier incorporated therein entirely operates in a differential mode. Accordingly, the signals directly applied to the output terminals of the differential amplifier are differential signals. If a differential signal is externally applied to Port 3, the signal flows to the collector of the transistor 2a, and is fed back to the base of the transistor 1a via a parasitic capacitance present between the input of the transistor 1a and the output of the transistor 2a. On the other hand, if a differential signal is externally applied to Port 4, the signal flows through the collector of the transistor 2b to the base of the transistor 1a via the feedback capacitor 7a. Accordingly, components of the differential signals applied to the collectors of the transistors 2a and 2b, which are in reverse phase with each other, mutually cancel each other. Moreover, the signal flowing to the collector of the transistor 2b is fed back to the base of the transistor 1b due to a parasitic capacitance present between the input of the transistor 1b and the output of the transistor 2b. On the other hand, the signal flowing to the collector of the transistor 2a is inputted into the base of the transistor 1b via the feedback capacitor 7b. Accordingly, components of the signals applied to the collectors of the transistors 2b and 2a, which are in reverse phase with each other, mutually cancel each other. Therefore, it is possible to prevent signals directly applied to the output terminals of the differential amplifier from returning to the input terminal side.

From the above description, it is understood that the differential amplifier is effective in enhancing the reverse isolation characteristic.

Figure 2:
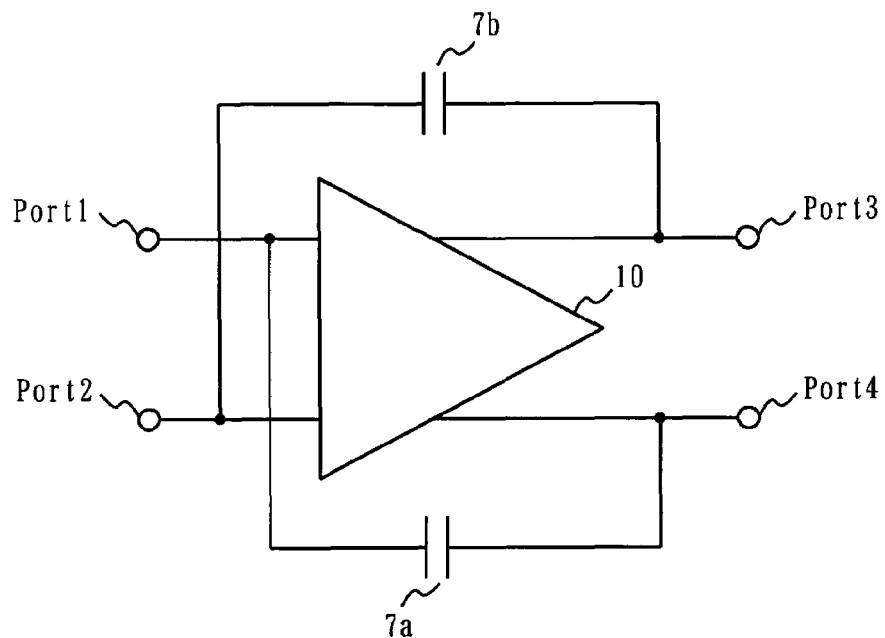
FIG. 2 is a block diagram used for explaining the concept of a return path of the differential amplifier shown in FIG. 1.

FIG. 2 is a block diagram used for explaining the concept of a return path of the differential amplifier shown in FIG. 1. In FIG. 2, the same elements as those shown in FIG. 1 are denoted by the same reference numerals. In FIG. 2, a differential amplification circuit 10 includes the transistors 1a, 1b, 2a, and 2b Port1 of the differential amplification circuit 10 is an input terminal which serves as a base terminal of the transistor 1a. Port2 of the differential amplification circuit 10 is an input terminal which serves as a base terminal of the transistor 1b. Port3 of the differential amplification circuit 10 is an output terminal which serves as a collector terminal of the transistor 2a. Port4 of the differential amplification circuit 10 is an output terminal which serves as a collector terminal of the transistor 2b. The feedback capacitor 7a is located between Port1 and Port4. The feedback capacitor 7b is located between Port2 and Port3.

Firstly, a discussion is provided as to how a signal outputted from an output terminal of a differential amplifier is prevented from returning to the input terminal side. Signals in reverse phase with each other are inputted into Port1 and Port2 of the differential amplification circuit 10. Signals in reverse phase with each other are outputted from Port3 and Port4 of the differential amplification circuit 10. The transistors 1a, 1b, 2a, and 2b constitute an inverting amplifier, and therefore a signal outputted from Port3 is in reverse phase with a signal inputted into Port1. Similarly, a signal outputted from Port4 is in reverse phase with a signal inputted into Port2. A signal fed back from Port3 to Port1 is in reverse phase with a signal applied to Port4, and the signal applied to Port4 flows through the feedback capacitor 7a to Port1, thereby canceling the signal fed back from Port3 to Port1. Similarly, a signal fed back from Port4 to Port2 is in reverse phase with a signal applied to Port3, and the signal applied to Port3 flows through the feedback capacitor 7b to Port2, thereby canceling the signal fed back from Port4 to Port2.

Next, consider a case where external signals are directly applied to the output terminals of the differential amplification circuit 10. Here, components in reverse phase contained in differential signals directly applied to Port3 and Port4 of a differential amplification circuit are simply described as signals. A signal fed back from Port3 to Port1 via a parasitic capacitance and a signal inputted from Port4 into Port1 via the feedback capacitor 7a are in reverse phase with each other, and therefore a signal directly applied to Port3 is cancelled by the signal inputted from Port4 into Port1 via the feedback capacitor 7a. Similarly, a signal fed back from Port4 to Port2 via a parasitic capacitance and a signal inputted from Port3 into Port2 via the feedback capacitor 7b are in reverse phase with each other, and therefore a signal directly applied to Port4 is cancelled by the signal inputted from Port3 into Port2 via the feedback capacitor 7b.

Figure 3:
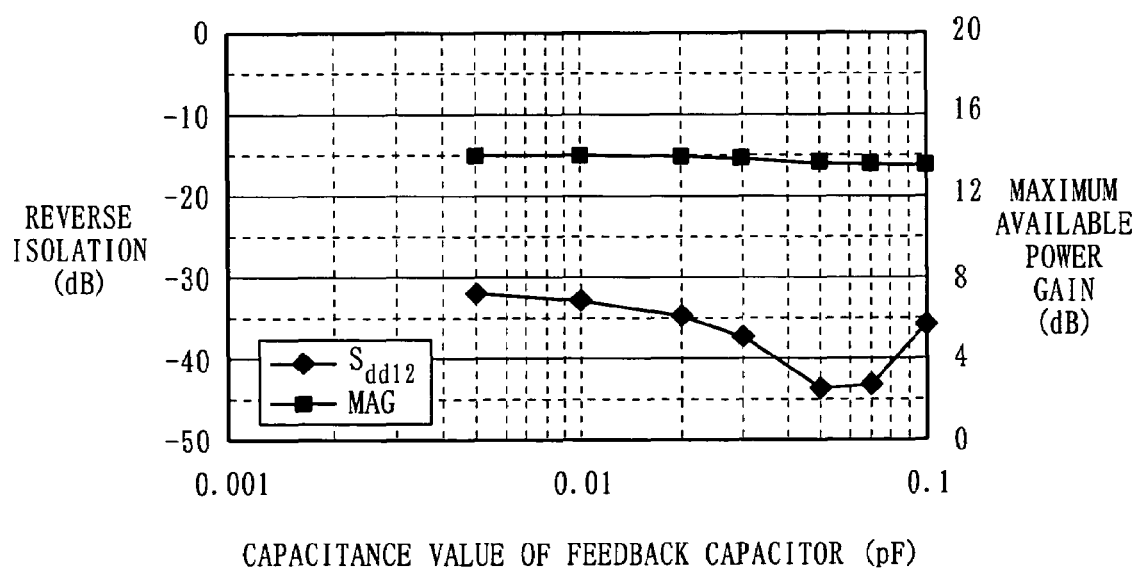
FIG. 3 is a graph showing reverse isolation (dB) and maximum available power gain (dB) measured for various capacitance values of feedback capacitors 7a and 7b of the differential amplifier shown in FIG. 1.

FIG. 3 is a graph showing reverse isolation (dB) and maximum available power gain (MAG) (dB) measured for various capacitance values of the feedback capacitors 7a and 7b of the differential amplifier shown in FIG. 1. Note that the measurements are performed with respect to a frequency of 5 GHz. In FIG. 3, the horizontal axis indicates capacitance values (pF) of the feedback capacitors 7a and 7b by a logarithmic scale, a left vertical axis indicates the reverse isolation (dB), and a right vertical axis indicates the maximum available power gain (dB).

In the measurements, the reverse isolation is obtained based on leakage $S_{dd12}$ of a differential signal from a differential output terminal to a differential input terminal. As is appreciated from FIG. 3, in the case where the differential amplifier includes no feedback capacitor, the reverse isolation is approximately −31.3 dB (see the reverse isolation at the capacitance value in the vicinity of 0.007 pF). It is also appreciated that if the differential amplifier is provided with a feedback capacitor having a capacitance value in the range between 0.05 pF and 0.07 pF, the reverse isolation is improved up to approximately −45 dB. In FIG. 3, although the maximum available power gain is reduced by approximately 0.5 dB with increase of the capacitance value of the feedback capacitor, such a reduction is not a practical problem.

As described above, in the first embodiment, a signal in reverse phase with a feedback signal fed back due to a parasitic capacitance is inputted into an input terminal via a feedback capacitor. Accordingly, even in a high frequency region above several hundreds MHz, the feedback signal is canceled, and therefore it is possible to enhance the reverse isolation characteristic, whereby it is possible to provide a differential amplifier for which a high cut-off frequency can be set. Such a differential amplifier is highly advantageous when used as an RF amplifier or a local amplifier of a communication apparatus, such as a mobile telephone, and achieves a significant industrial effect.

Further, in the first embodiment, capacitors are located between output and input terminals of cascade-amplifiers (i.e., between Port1 and Port4, and between Port2 and Port3). As described above, a cascode-amplifier intrinsically has a satisfactory reverse isolation characteristic, and therefore a parasitic capacitance is small between Port1 and Port3 and between Port2 and Port4. Accordingly, it is possible to set a small capacitance value for each of the feedback capacitors 7a and 7b which are respectively provided between Port1 and Port4 and between Port2 and Port3 in order to cancel feedback signals. Therefore, the present invention is able to provide a small-footprint differential amplifier.

Figure 4:
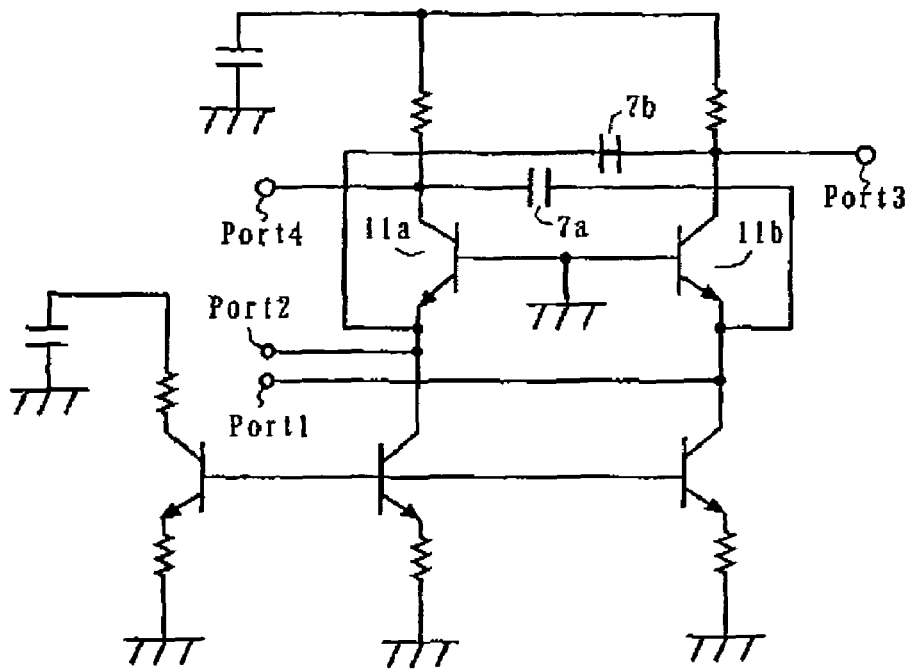
FIG. 4 is a circuit diagram of a base-grounded differential amplifier.
Figure 5:
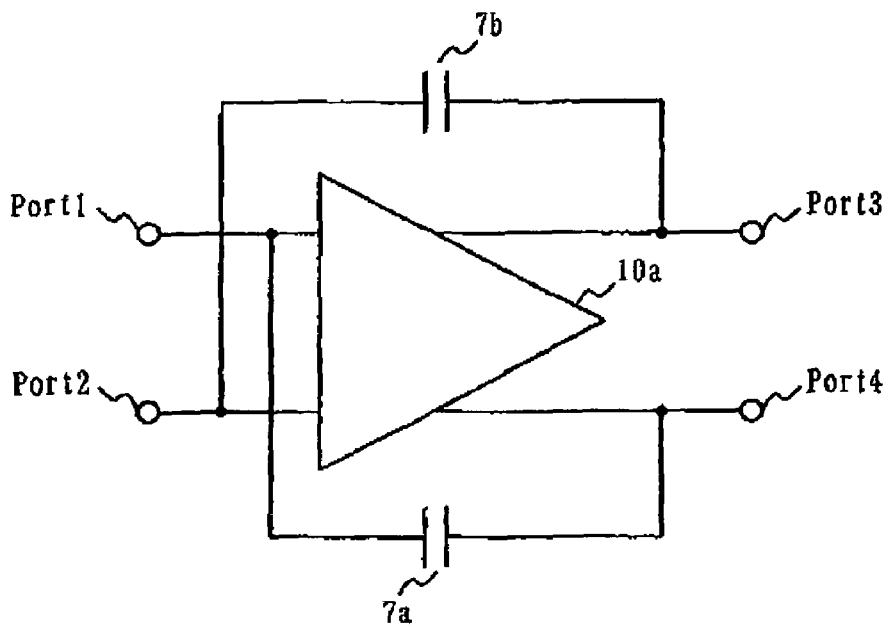
FIG. 5 is a block diagram used for explaining the concept of a return path of the differential amplifier shown in FIG. 4.

Note that the differential amplification circuit 10 does not have to include cascode amplifiers so long as a difference in potential between two input signals in reverse phase with each other, which are inputted into first and second input terminals, is amplified, and two resultant output signals in reverse phase with each other are outputted from the first and second input terminals. One example of such a differential amplification circuit configured with no cascode amplifier is a base-grounded differential amplifier. FIG. 4 is a circuit diagram of a base-grounded differential amplifier. FIG. 5 is a block diagram used for explaining the concept of a return path of the differential amplifier shown in FIG. 4. In FIG. 4, transistors 11a and 11b constitute a base-grounded non-inverting amplifier 10a. Differential input signals in reverse phase with each other are inputted into Port1 and Port2. Since the transistors 11a and 11b constitute the non-inverting amplifier 10a, the differential input signals are outputted from Port3 and Port4 without being inverted. Accordingly, the signals outputted from Port3 and Port4 are also in reverse phase with each other. Therefore, a signal fed back from Port3 to Port1 is in reverse phase with a signal applied to Port4, and the signal applied to Port4 flows through the feedback capacitor 7a to Port1, thereby canceling the signal fed back from Port3 to Port1. Similarly, a signal fed back from Port4 to Port2 is in reverse phase with a signal applied to Port3, and the signal applied to Port3 flows through the feedback capacitor 7b to Port2, thereby canceling the signal fed back from Port4 to Port2. The same as above can be said about a case where external differential signals are directly inputted into Port3 and Port4. Thus, it is possible to provide a differential amplifier having an enhanced reverse isolation characteristic.

Note that as is apparent from the foregoing, it is possible to suppress a signal leaking from input to output terminals.

(Second Embodiment)

Figure 6:
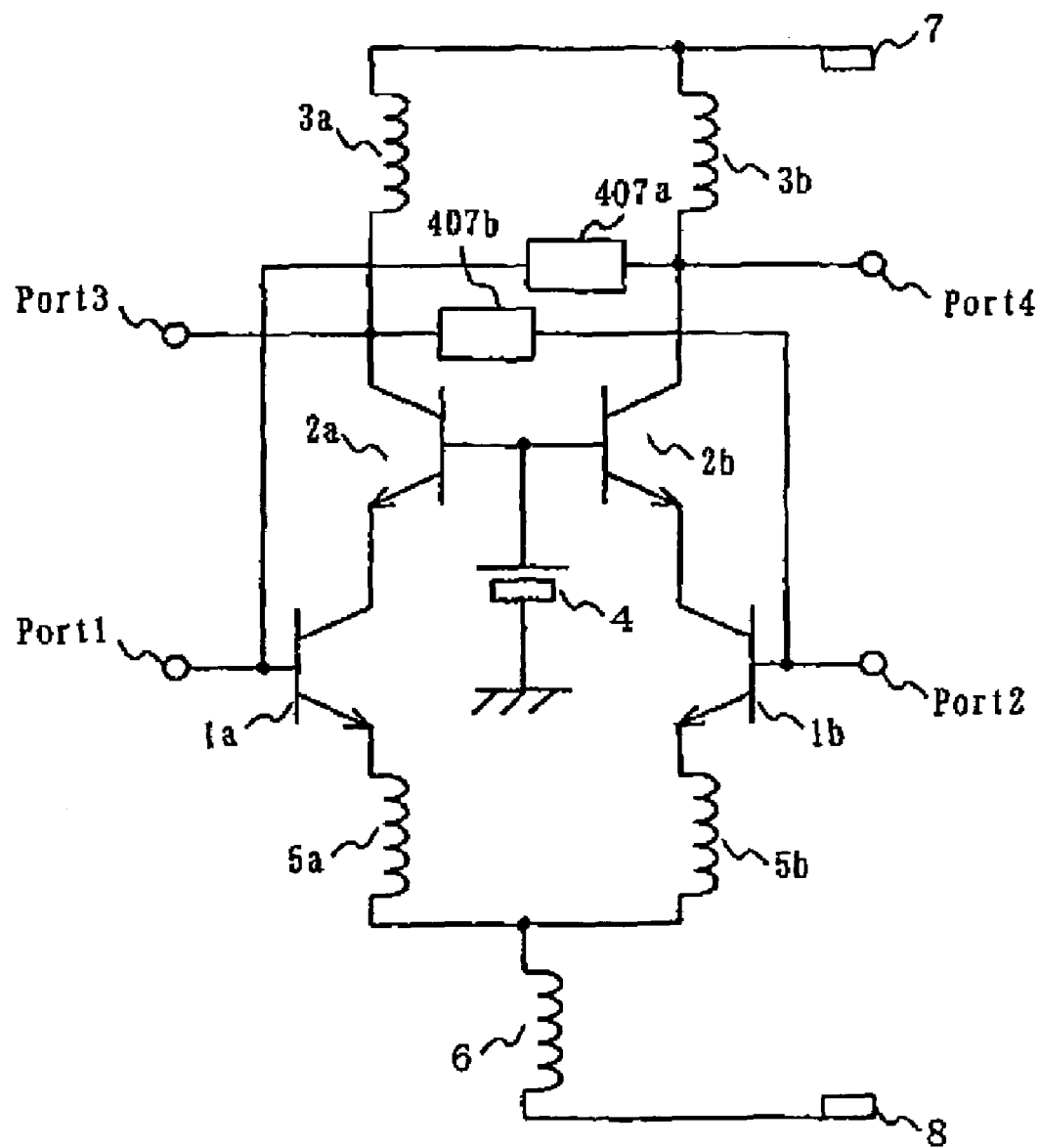
FIG. 6 is a circuit diagram of a cascode-type differential amplifier according to a second embodiment of the present invention.

FIG. 6 is a circuit diagram of a cascode-type differential amplifier according to a second embodiment of the present invention. In FIG. 6, elements similar to those of the differential amplifier according to the first embodiment are denoted by the same reference numerals, and detailed descriptions thereof are omitted. As is apparent from FIG. 6, the differential amplifier according to the second embodiment includes passive element circuits 407a and 407b each formed by passive elements, such as a capacitor, a resistor, an inductor, etc., instead of including the feedback capacitors included in the differential amplifier according to the first embodiment.

Figure 7:
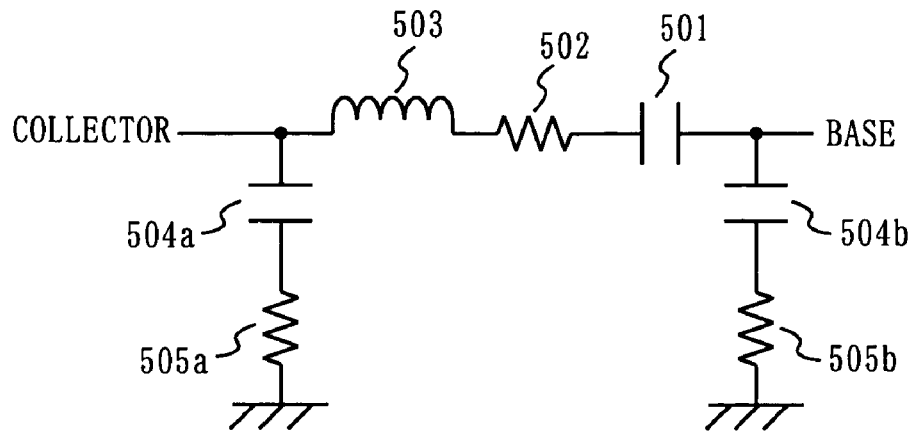
FIG. 7 is a diagram showing a specific example of circuit structures of passive element circuits 407a and 407b.

FIG. 7 is a diagram showing a specific example of circuit structures of the passive element circuits 407a and 407b. The circuit structures of the passive element circuits 407a and 407b are identical to each other, and therefore the following descriptions are directed only to the circuit structure of the passive element circuit 407a.

In FIG. 7, the passive element circuit 407a includes capacitors 501, 504a, and 504b, resistors 502, 505a, and 505b, and an inductor 503. The capacitor 501, the resistor 502, and the inductor 503 are connected in series between a base of the transistor 1b and a collector of the transistor 2a. The capacitor 504b and the resistor 505b are connected in parallel between the base of the transistor 1b and the capacitor 501. One end of the resistor 505b is grounded. The capacitor 504a and the resistor 505a are connected in parallel between the collector of the transistor 2a and the inductor 503. One end of the resistor 505a is grounded.

Figure 8:
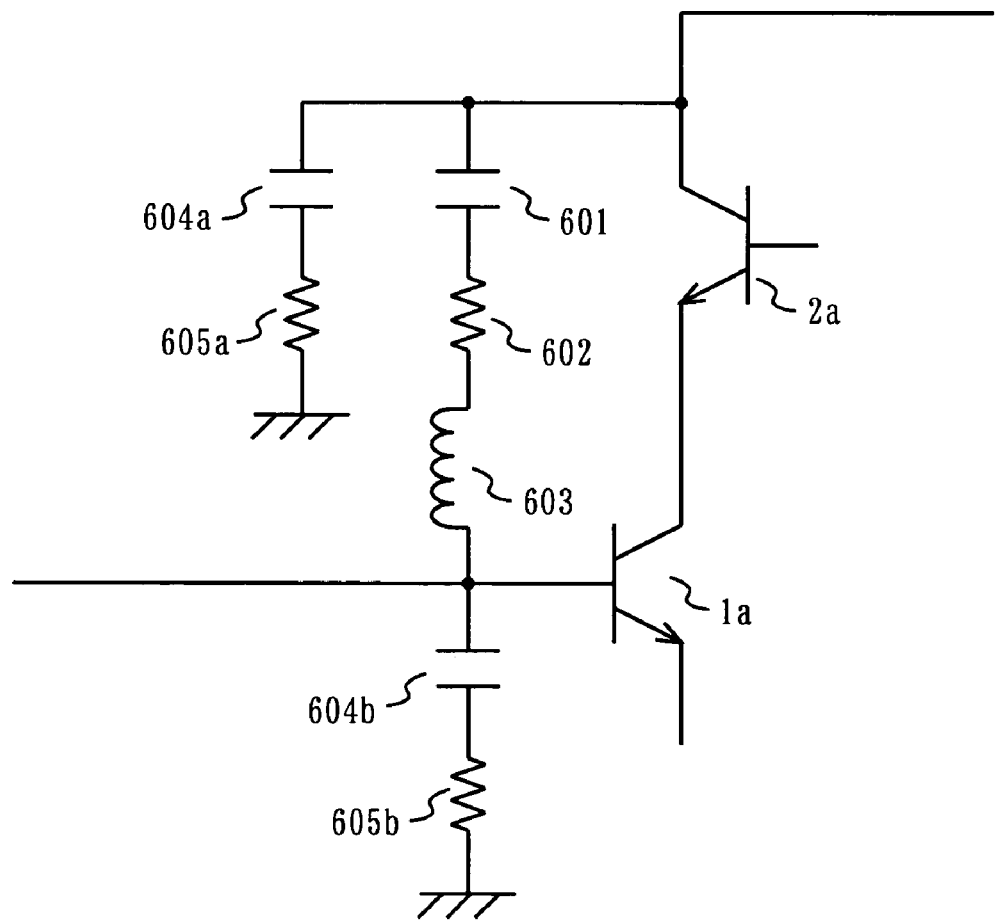

FIG. 8 is a diagram illustrating parasitic components, such as parasitic capacitances, parasitic resistances, and parasitic inductances, which are present between a base of the transistor 1a and the collector of the transistor 2a. Parasitic components present between the base of the transistor 1b and a collector of the transistor 2b are similar to those illustrated in FIG. 8, and therefore are not shown in the drawings.

In FIG. 8, a parasitic capacitance 601 present between an output of the transistor 1a and an output of the transistor 2a, a parasitic resistance 602 such as a wire conductor, and a parasitic inductance 603 such as a wire conductor, are connected in series between the base of the transistor 1a and the collector of the transistor 2a. Further, a parasitic capacitance 604a present between a wire conductor and a silicone substrate, and a parasitic resistance 605a on the silicon substrate are connected in parallel between the collector of the transistor 2a and the parasitic capacitance 601. Furthermore, a parasitic capacitance 604b present between a wire conductor and the silicone substrate, and a parasitic resistance 605b on the silicon substrate are connected in parallel between the base of the transistor 1a and the parasitic inductance 603.

A passive element circuit from the collector of the transistor 2a to the base of the transistor 1a is represented by an equivalent circuit as illustrated in FIG. 8. Accordingly, in the case where the passive element circuit 407a shown in FIG. 7, which is equivalent to the equivalent circuit shown in FIG. 8, is connected between the collector of the transistor 2b and the base of the transistor 1a, a feedback signal from the collector of the transistor 2a to the base of the transistor 1a and a signal inputted from the collector of the transistor 2b through the passive element circuit 407a to the transistor 1a are equivalent in amplitude and in reverse phase with each other. Accordingly, the feedback signal from the collector of the transistor 2a to the base of the transistor 1a is canceled. Therefore, it is possible to provide a differential amplification circuit having an enhanced reverse isolation characteristic.

Figure 9:
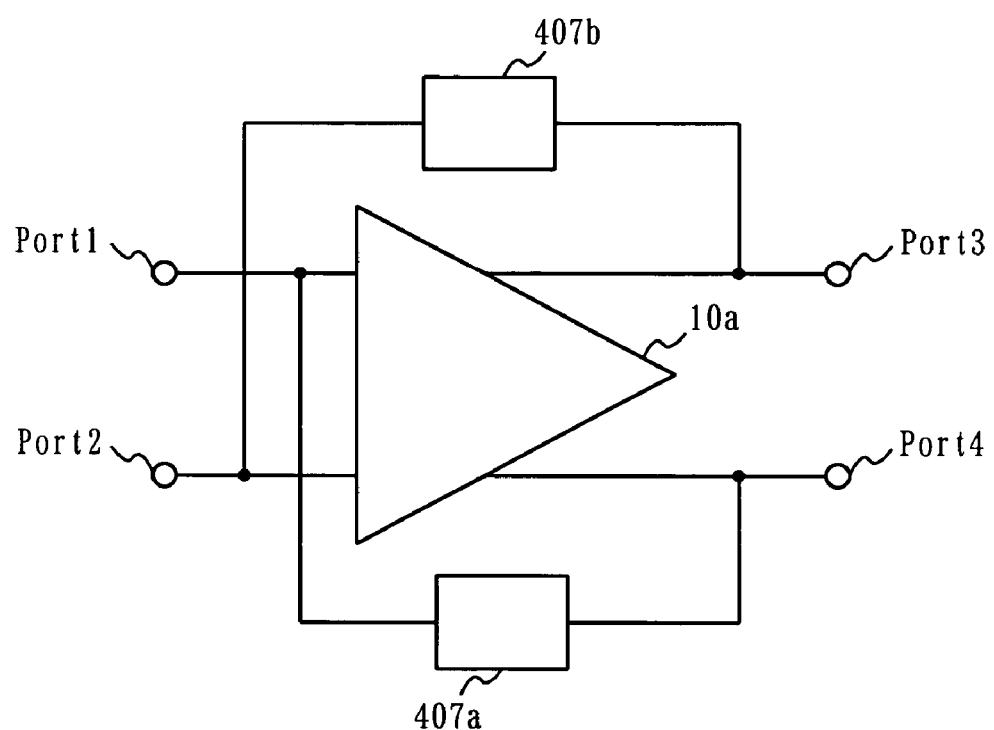
FIG. 9 is a block diagram used for explaining the concept of a return path of the differential amplifier shown in FIG. 6.

FIG. 9 is a block diagram used for explaining the concept of a return path of the differential amplifier shown in FIG. 6. In FIG. 9, elements similar to those of the differential amplifier shown in FIG. 6 are denoted by the same reference numerals. In FIG. 9, the parasitic element circuit 407a is connected between Portland Port4, and the passive element circuit 407b is connected between Port2 and Port3.

Port1 and Port2 of the differential amplification circuit 10 receive signals which are equivalent in amplitude and in reverse phase with each other. Port3 and Port4 of the differential amplification circuit 10 output signals which are equivalent in amplitude and in reverse phase with each other. A signal fed back from Port3 to Port1 and a signal applied to Port4 are equivalent in amplitude and in reverse phase with each other, and the signal applied to Port4 is inputted into Port1 via the passive element circuit 407a, thereby canceling the signal fed back from Port3 to Port1. Similarly, a signal fed back from Port4 to Port2 and a signal applied to Port3 are equivalent in amplitude and in reverse phase with each other, and the signal applied to Port3 is inputted into Port2 via the passive element circuit 407b, thereby canceling the signal fed back from Port4 to Port2.

As described above, in the differential amplifier according to the second embodiment, a signal having an equivalent amplitude and a reversed phase with respect to a feedback signal fed back via a parasitic capacitance, etc., is inputted into an input terminal of the differential amplifier via a passive element circuit. Accordingly, unlike in the differential amplifier according to the first embodiment in which only a feedback signal in a specific frequency band is canceled by the feedback capacitor, in the differential amplifier according to the second embodiment, differential signals which are equivalent in amplitude and in reverse phase with each other are obtained even in a frequency band of above several hundreds MHz, and therefore it is possible to cancel feedback signals over a wide frequency range. Accordingly, it is possible to enhance the reverse isolation characteristic, whereby it is possible to provide a differential amplifier for which a high cut-off frequency can be set. Such a differential amplifier is highly advantageous when used as an RF amplifier or a local amplifier of a communication apparatus, such as a mobile telephone, and achieves a significant industrial effect.

Note that even if a portion of the circuit shown in FIG. 8 is used instead of using the passive element circuits 407a or 407b, it is possible to achieve the same effect as that described in the second embodiment.

It goes without saying that the passive circuits described in the second embodiment may be provided in a differential amplification circuit as shown in FIG. 4 which does not include a cascode amplifier.

(Third Embodiment)

In an RF amplifier or a local amplifier, it is necessary to enhance the reverse isolation characteristic in a limited predetermined frequency band. Accordingly, it is necessary to provide a circuit for controlling a bandpass amplitude and phase characteristic of a passive element circuit in the limited frequency band, and it is also necessary to prevent abnormal oscillation from occurring due to a positive feedback in frequency bands other than the limited frequency band.

Figure 10:
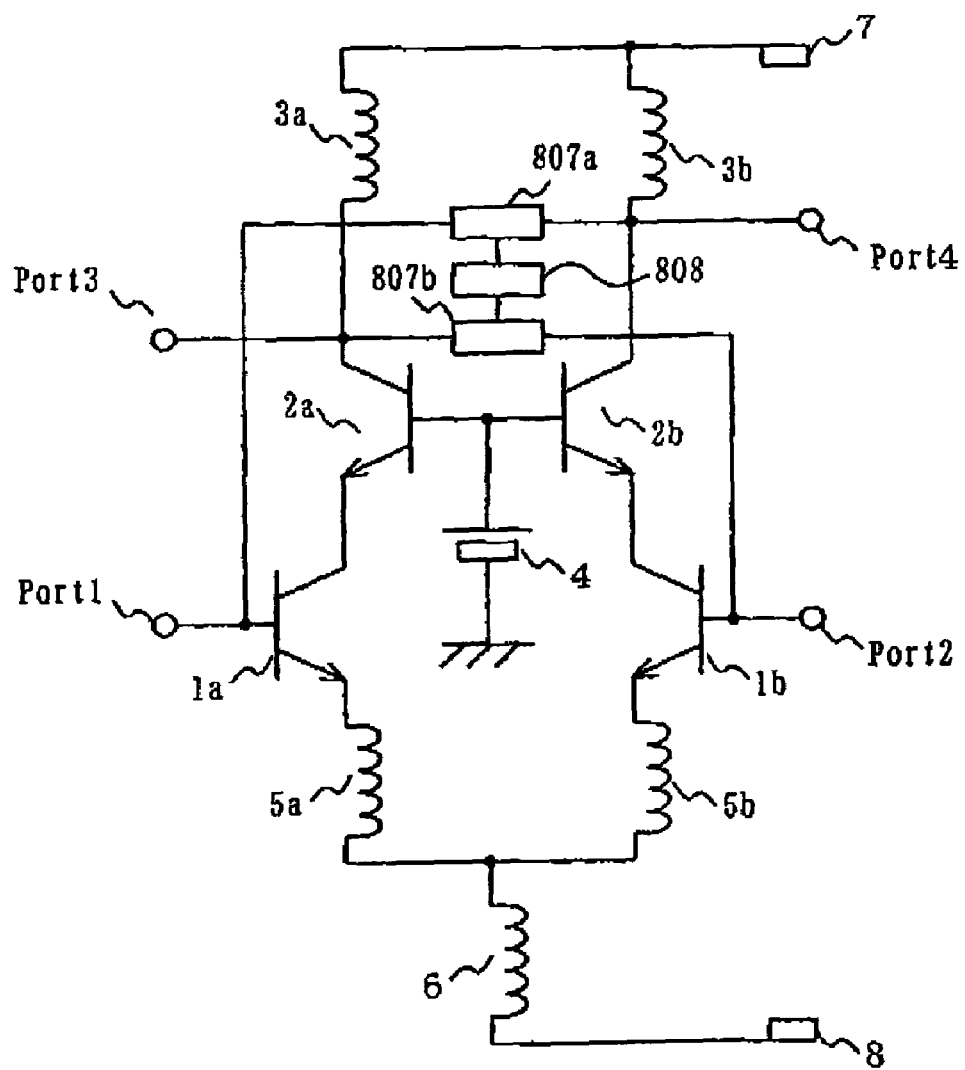
FIG. 10 is a circuit diagram of a cascode-type differential amplifier according to a third embodiment of the present invention.

FIG. 10 is a circuit diagram of a cascode-type differential amplifier according to a third embodiment of the present invention. In FIG. 10, elements similar to those of the differential amplifier according to the first embodiment are denoted by the same reference numerals, and descriptions thereof are omitted. As is apparent from FIG. 10, in the third embodiment, passive element circuits 807a and 807b formed by capacitors and resistors, and a parallel resonant circuit 808 formed by capacitors and inductors are used instead of using the feedback capacitors described in the first embodiment.

Figure 11:
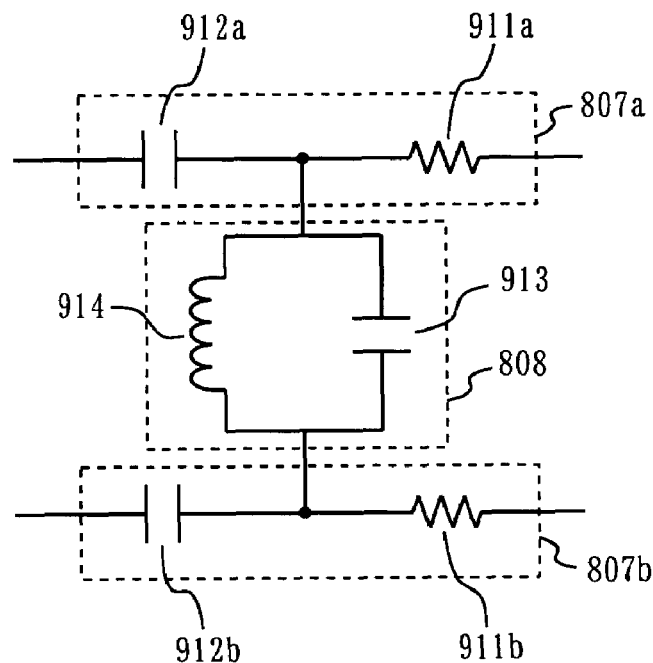
FIG. 11 is a diagram illustrating a specific example of circuit structures of passive element circuits 807a and 807b and a parallel resonant circuit 808.

FIG. 11 is a diagram illustrating a specific example of circuit structures of the passive element circuits 807a and 807b and the parallel resonant circuit 808. In FIG. 11, the passive element circuit 807a includes a capacitor 912a and a resistor 911a which are connected in series with each other, the passive element circuit 807b includes a capacitor 912b and a resistor 911b which are connected in series with each other, and the parallel resonant circuit 808 includes a capacitor 913 and an inductor 914 which are connected in parallel with each other. One end of the parallel resonant circuit 808 is connected between the capacitor 912a and the resistor 911a, and the other end thereof is connected between the capacitor 912b and the resistor 911b.

A resonance frequency of the parallel resonant circuit 808 is set within the range of a predetermined frequency band in which the reverse isolation characteristic is desired to be enhanced. Accordingly, the parallel resonant circuit 808 has substantially an open impedance in the predetermined frequency band in which the reverse isolation characteristic is desired to be enhanced, while substantially having a short impedance in other frequency bands. Accordingly, in comparison with an impedance between an input and an output of the parallel resonant circuit 808, the impedance of the parallel resonant circuit 808 is high in the predetermined frequency band and low in other frequency bands.

Accordingly, in the predetermined frequency band in which the reverse isolation characteristic is desired to be enhanced, a signal applied to the collector of the transistor 2b is fed back to the base of the transistor 1a, and a signal applied to the collector of the transistor 2a is fed back to the base of the transistor 1b, thereby enhancing the reverse isolation characteristic.

On the other hand, in frequency bands other than the predetermined frequency band, no signal is fed back via the passive element circuits 807a and 807b. Moreover, the resistors 911a and 911b each play a role of a damping resistor, thereby preventing abnormal oscillation from occurring due to a positive feedback.

Figure 12:
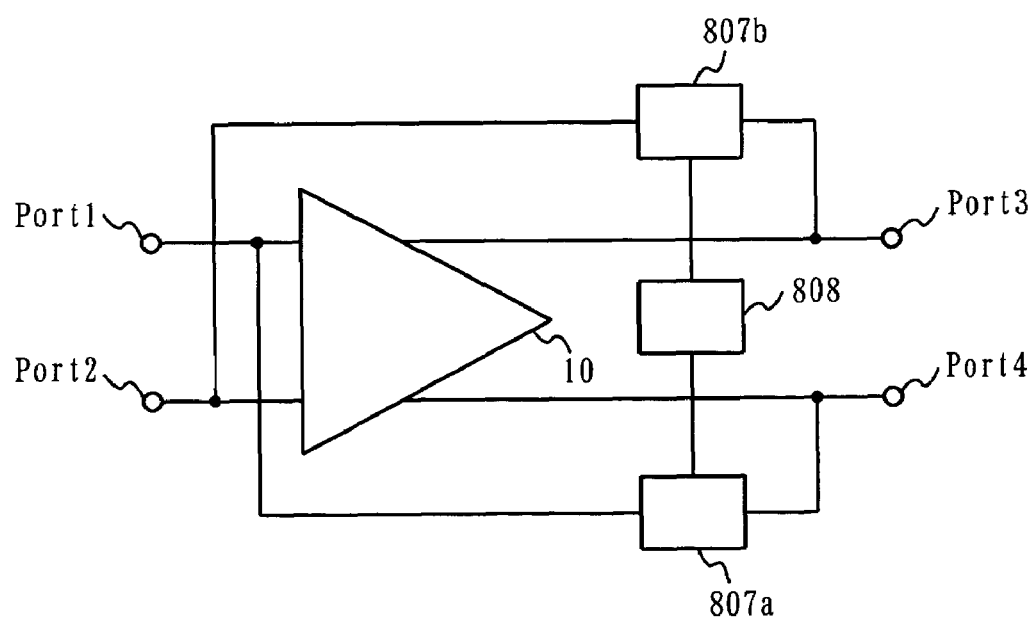
FIG. 12 is a block diagram used for explaining the concept of a return path of the differential amplifier shown in FIG. 10.

FIG. 12 is a block diagram used for explaining the concept of a return path of the differential amplifier shown in FIG. 10. In FIG. 12, elements similar to those of the differential amplifier shown in FIG. 10 are denoted by the same reference numerals. In FIG. 12, the passive element circuit 807a is connected between Port1 and Port4. The passive element circuit 807b is connected between Port2 and Port3. The parallel resonant circuit 808 is connected between the passive element circuits 807a and 807b.

As described above, in the third embodiment, it is possible to cancel only a feedback signal in a limited predetermined frequency range, thereby preventing abnormal oscillation from occurring in frequency ranges other than the predetermined frequency range.

Note that although the third embodiment has been described with respect to a case of using the parallel resonant circuit 808, the present invention is not limited to this. Any passive element circuit can be used so long as it has substantially an open impedance in a frequency band in which the reverse isolation characteristic is desired to be enhanced, while having a short impedance in other frequency bands.

Note that although the third embodiment has been described with respect to a case where an inductor is connected to each of the transistors 2a and 2b, the same effect can be achieved by connecting a resistor instead of connecting the inductor.

Note that although the third embodiment has been described with respect to a case of using bipolar transistors, the same effect can be achieved by using MOSFETs.

Note that it goes without saying that the circuit as described in the third embodiment can be provided in a differential amplification circuit as shown in FIG. 4 which does not include a cascode amplifier.

(Fourth Embodiment)

Figure 13:
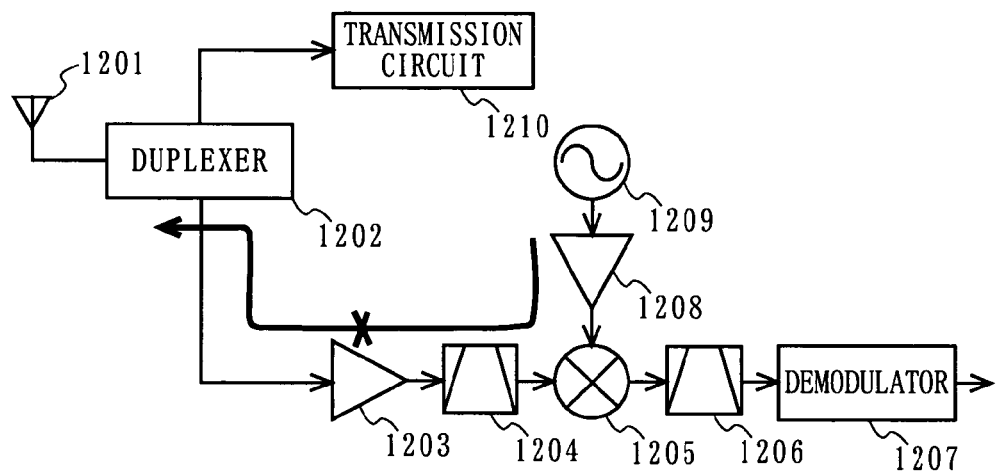
FIG. 13 is a diagram illustrating a structure of a radio circuit according to a fourth embodiment of the present invention.

FIG. 13 is a diagram illustrating a structure of a radio circuit according to a fourth embodiment of the present invention. In FIG. 13, the radio circuit includes an antenna 1201, a duplexer 1202, a low noise amplifier (LNA) 1203, a bandpass filter 1204, a downmixer 1205, a bandpass filter 1206, a demodulator 1207, a local amplifier 1208, and an oscillator 1209.

A signal received by the antenna 1201 is inputted into the LNA 1203 via the duplexer 1202. The LNA 1203 amplifies and outputs the received signal through the bandpass filter 1204 to the downmixer 1205. The downmixer 1205 uses a local signal, which is outputted from the oscillator 1209 and amplified by the local amplifier 1208, to downconvert the amplified signal outputted from the LNA 1203, and a resultant signal is inputted into the demodulator 1207 via the bandpass filter 1206.

In the fourth embodiment, a differential amplifier according to one of the first through third embodiments is used as the LNA 1203.

A local signal leaking from the downmixer 1205 as shown in FIG. 13 flows toward the output of the LNA 1203. The LNA 1203 has a high reverse isolation characteristic, and therefore the leaking local signal is prevented from returning to the input of the LNA 1203. Accordingly, it is possible to reduce the level of the leaking local signal reradiated from the antenna 1201.

Figure 14:
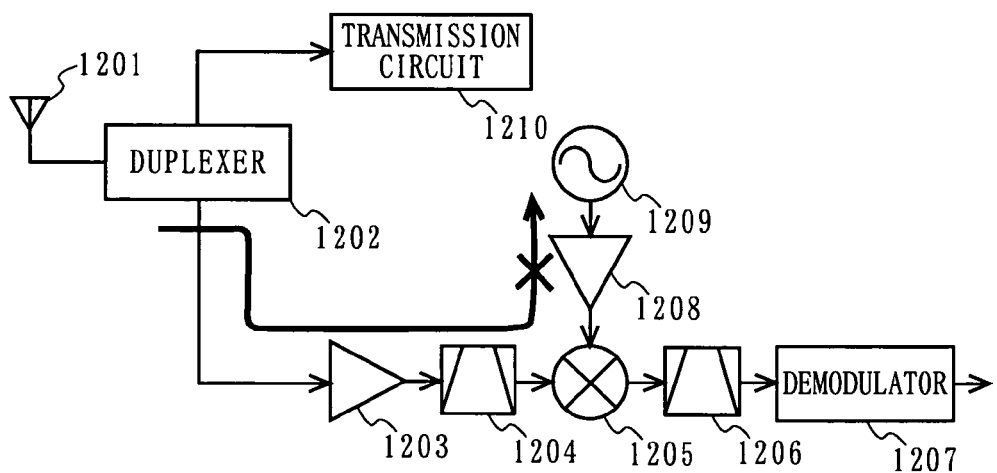
FIG. 14 is a diagram used for explaining an effect achieved when a differential amplifier according to one of the first through third embodiments is used as a local amplifier 1208.

Note that a differential amplifier according to one of the first through third embodiments may be used as the local amplifier 1208. FIG. 14 is a diagram used for explaining an effect achieved when the differential amplifier according to one of the first through third embodiments is used as the local amplifier 1208.

A large input signal received by the antenna 1201 as shown in FIG. 14 leaks from the downmixer 1205 toward the local amplifier 1208. The local amplifier 1208 has a high reverse isolation characteristic, and therefore the leaking signal is prevented from being fed back to the input side of the local amplifier 1208. Accordingly, it is possible to reduce the level of the large input signal inputted into the oscillator 1209, whereby it is possible to minimize deterioration of a noise characteristic of the oscillator 1209 due to the large input signal inputted into the oscillator 1209.

(Fifth Embodiment)

Figure 15:
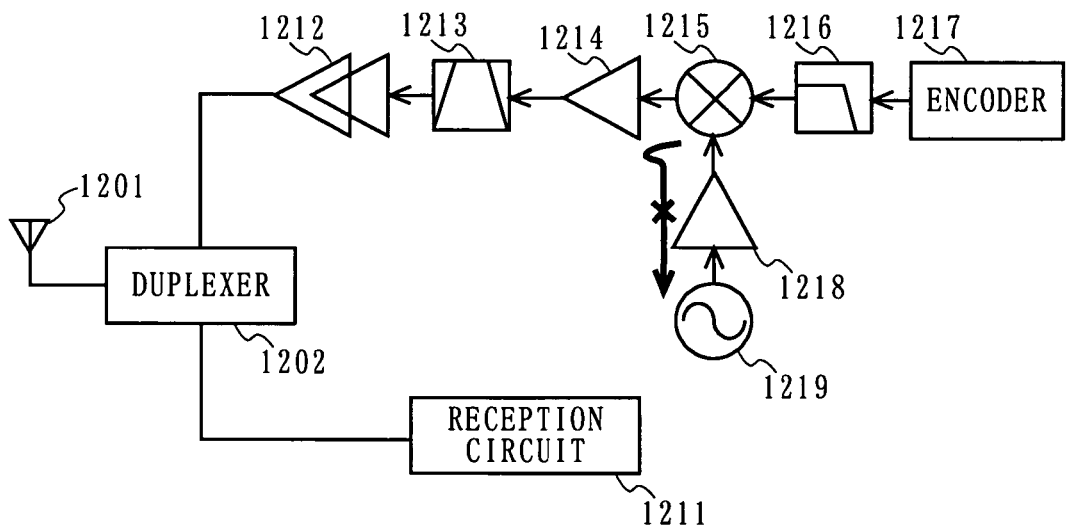
FIG. 15 is a diagram illustrating a structure of a radio circuit according to a fifth embodiment of the present invention.

FIG. 15 is a diagram illustrating a structure of a radio circuit according to a fifth embodiment of the present invention. In FIG. 15, the radio circuit includes the antenna 1201, the duplexer 1202, a reception circuit 1211, a power amplifier 1212, a bandpass filter 1213, a driver amplifier 1214, an upmixer 1215, a lowpass filter 1216, an encoder 1217, a buffer amplifier 1218, and an oscillator 1219.

A local signal outputted from the oscillator 1219 is amplified by the buffer amplifier 1218 and inputted into the upmixer 1215. The upmixer 1215 upconverts an IF signal received from the encoder 1217 via the lowpass filter 1216. The upconverted signal is amplified by the driver amplifier 1214, flows through the bandpass filter 1213 to the power amplifier 1212, and is further amplified by the power amplifier 1212. The amplified signal flows through the duplexer 1202, and is outputted from the antenna 1201.

In the case where a conventional amplifier is used as the buffer amplifier 1218, the following problem might occur. A portion of an RF signal outputted from the upmixer 1215 is reflected at the input of the driver amplifier 1214. The reflected portion leaks through the upmixer 1215 from an RF output terminal to a LO input terminal, and further flows through the buffer amplifier 1218 to the oscillator 1219. This signal deteriorates the noise characteristic of a local signal outputted from the oscillator 1219, causing deterioration in modulation accuracy of a modulating signal outputted from a transmission circuit. Moreover, the deterioration of the noise characteristic of the signal outputted from the oscillator 1219 results in deterioration of an out-of-band noise characteristic of the signal outputted from the transmission circuit, so that unwanted radiation from the antenna 1202 is caused to become out of specification.

Accordingly, in the fifth embodiment, a differential amplifier according to one of the first through third embodiments is used as the buffer amplifier 1218.

The buffer amplifier 1218 has a high reverse isolation characteristic, and therefore a signal reflected from the driver amplifier 1214 as shown in FIG. 15 is prevented form returning to the input side of the buffer amplifier 1218. Accordingly, it is possible to reduce the leakage of an RF signal to the oscillator 1219, whereby it is possible to reduce deterioration of the noise characteristic of the oscillator 1219.

Figure 16:
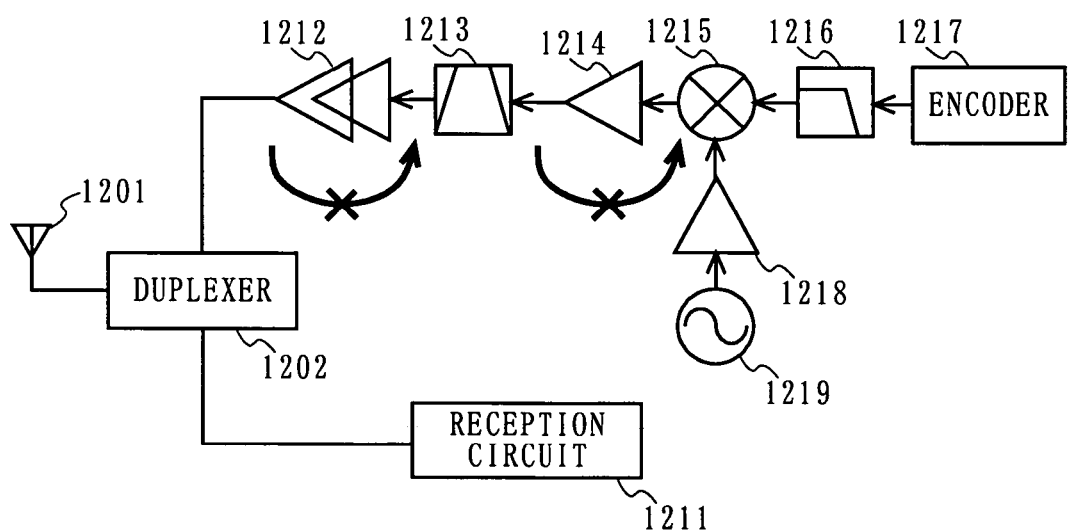
FIG. 16 is a diagram used for explaining an effect achieved when a power amplifier 1212 and/or a driver amplifier 1214 is/are realized by a differential amplifier according to one of the first through third embodiments.

Note that the power amplifier 1212 and/or the driver amplifier 1214 may be realized by a differential amplifier according to one of the first through third embodiments. FIG. 16 is a diagram used for explaining an effect achieved when the power amplifier 1212 and/or the driver amplifier 1214 are realized by a differential amplifier according to one of the first through third embodiments.

If an RF signal outputted from the power amplifier 1212 is reflected from the duplexer 1202 and positively fed back to the input of the power amplifier 1212, the power amplifier 1212 might be caused to abnormally oscillate or malfunction. A similar problem might be caused to the driver amplifier 1214. Accordingly, the differential amplifier according to one of the first through third embodiments is used as the power amplifier 1212 and/or the driver amplifier 1214. As a result, the positively fed back RF signal is amplified by the power amplifier 1212 and/or the driver amplifier 1214, but canceled by the action of feedback capacitors. Accordingly, it is possible to provide a transmission circuit free from abnormal oscillation and malfunction.

(Sixth Embodiment)

Figure 17:
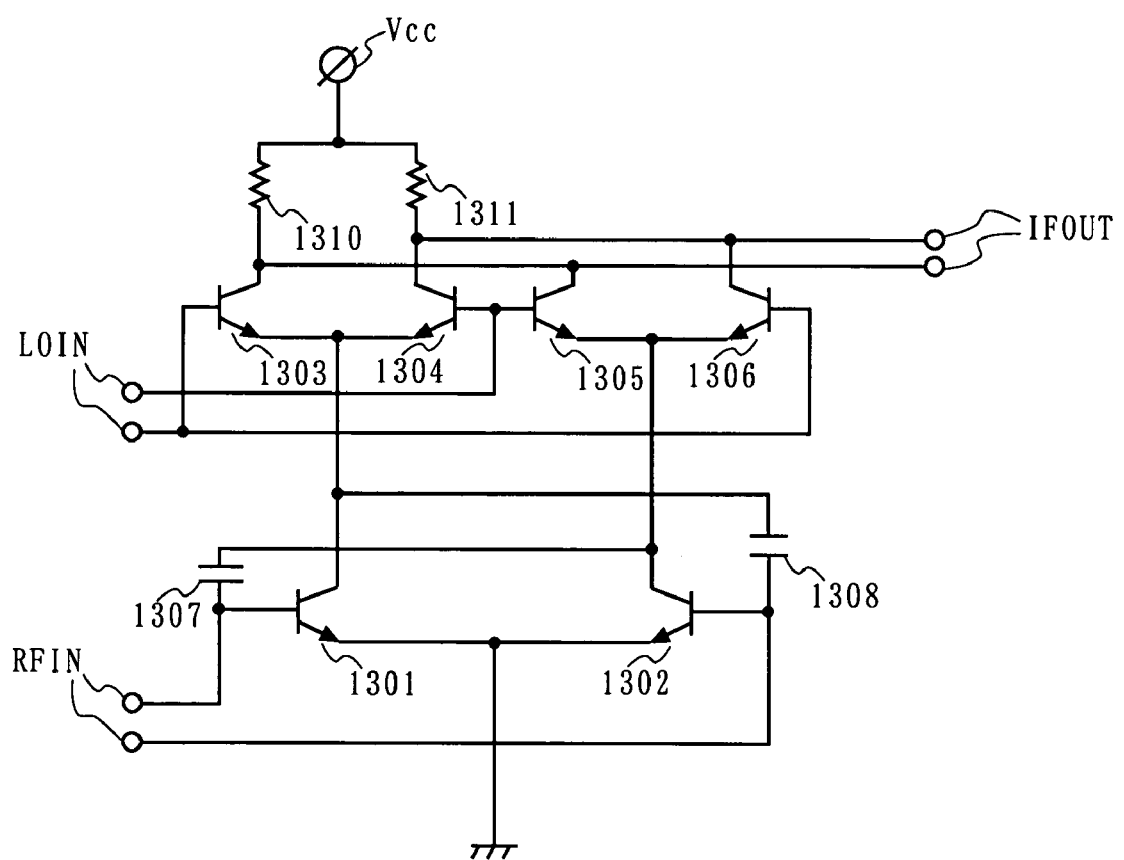
FIG. 17 is a circuit diagram of a differential downmixer according to a sixth embodiment of the present invention.

FIG. 17 is a circuit diagram of a differential downmixer according to a sixth embodiment of the present invention. In FIG. 17, the differential downmixer includes transistors 1301, 1302, 1303, 1304, 1305, and 1306, feedback capacitors 1307 and 1308, and resistors 1310 and 1311.

Emitters of the transistors 1301 and 1302 are connected together and grounded. A collector of the transistor 1301 is connected to a base of the transistor 1302 via the feedback capacitor 1308. The collector of the transistor 1301 is also connected to emitters of the transistors 1303 and 1304. A base of the transistor 1301 is connected to a collector of the transistor 1302 via the feedback capacitor 1307. A collector of the transistor 1302 is connected to emitters of the transistors 1305 and 1306. The bases of the transistors 1301 and 1302 are connected to an RF signal input terminal RFIN.

Bases of the transistors 1303 and 1306 are connected together to a local signal input terminal LOIN. Bases of the transistors 1304 and 1305 are connected together to the local signal input terminal LOIN. Collectors of the transistors 1303 and 1305 are connected together to a power supply voltage Vcc via the resistor 1310 and to an IF signal output terminal IFOUT. Collectors of the transistors 1304 and 1306 are connected together to the power supply voltage Vcc via the resistor 1311 and to the IF signal output terminal IFOUT.

For example, a signal received by the antenna 1201 as shown in FIG. 13 is inputted to the RF signal input terminal RFIN, and a local signal outputted from the oscillator 1209 is inputted into the local signal input terminal LOIN. As a result, a signal having a frequency corresponding to a difference between these signals is outputted from the IF signal output terminal IFOUT.

In the circuit structure as shown in FIG. 17, although differential components of local signals are fed back via parasitic capacitances of the transistors 1301 and 1302, components in reverse phase contained in feedback signals are canceled by the actions of the feedback capacitors 1307 and 1308. Accordingly, levels of the local signals leaking into the RF signal input terminal side are reduced. As a result, levels of the local signals reradiated from the antenna are reduced.

Note that although a grounded emitter differential circuit including the transistors 1301 and 1302 is used in the circuit structure shown in FIG. 17, the present invention is not limited to this. Any differential circuit can be used so long as feedback capacitors are provided so as to cancel components in reverse phase contained in feedback signals. FIG. 18 is a diagram illustrating a structure of a differential mixer including cascode amplifiers. In FIG. 18, elements similar to those shown in FIG. 17 are denoted by the same reference numerals. As is apparent from FIG. 18, cascode-connected transistors 1301a and 301b, and cascode-connected transistors 1302a and 1302b are used. A base of the transistor 1301a is connected to a collector of the transistor 1302b via the feedback capacitor 1307, and a base of A gate of the FET 1402a is connected to a drain of the FET 1402b. Sources of the FETs 1402a and 1402b are connected together and grounded via the constant-current supply 1401. A drain of the FET 1402a is connected to a source of the FET 1402b. Connected between the drains of the FETs 1402a and 1402b are the capacitor 1403a and 1403b connected in series, and the inductors 1404a and 1404b connected in series. Connected between the inductors 1404a and 1404b are emitters of the transistors 1406a and 1406b. A base of the transistor 1406a is connected to the drain of the FET 1402a via the capacitor 1405a. The base of the transistor 1406a is also connected to a collector of the transistor 1406b via the feedback capacitor 1407a. A base of the transistor 1406b is connected to the drain of the FET 1402b via the capacitor 1405b. The base of the transistor 1406b is also connected to the collector of the transistor 1406a via the feedback capacitor 1407. Connected between the collectors of the transistors 1406a and 1406b are the inductors 1408a and 1408b connected in series. The collector of the transistor 1406a is connected to an output terminal OUT2 via the capacitor 1409b. The collector of the transistor 1406b is connected to an output terminal OUT1 via the capacitor 1409a. Connected between the inductors 1408a and 1408b is the power supply voltage Vcc.

A differential oscillation circuit is formed by the FETs 1402a and 1402b, the capacitors 1403a and 1403b, and the inductors 1404a and 1404b. the transistor 1302a is connected to a collector of the transistor 1301b via the feedback capacitor 1308. This cancels components in reverse phase contained in local signals leaking into output sides of the cascode amplifiers, and therefore levels of the local signals leaking toward the RF signal input terminal are reduced. As a result, levels of the local signals reradiated from the antenna are reduced. Moreover, capacitances of the feedback capacitors can be reduced by employing the circuit structure shown in FIG. 18, whereby it is possible to reduce a footprint of the differential downmixer.

Note that the differential amplifier shown in FIG. 17 or 18 can be used as a differential upmixer.

Further, the differential amplifier shown in FIG. 17 or 18 can be used as the downmixer 1205 shown in FIGS. 13 and 14.

Furthermore, the differential downmixer shown in FIG. 17 or 18 can be used as the differential upmixer shown in FIGS. 15 and 16.

(Seventh Embodiment)

Figure 19:
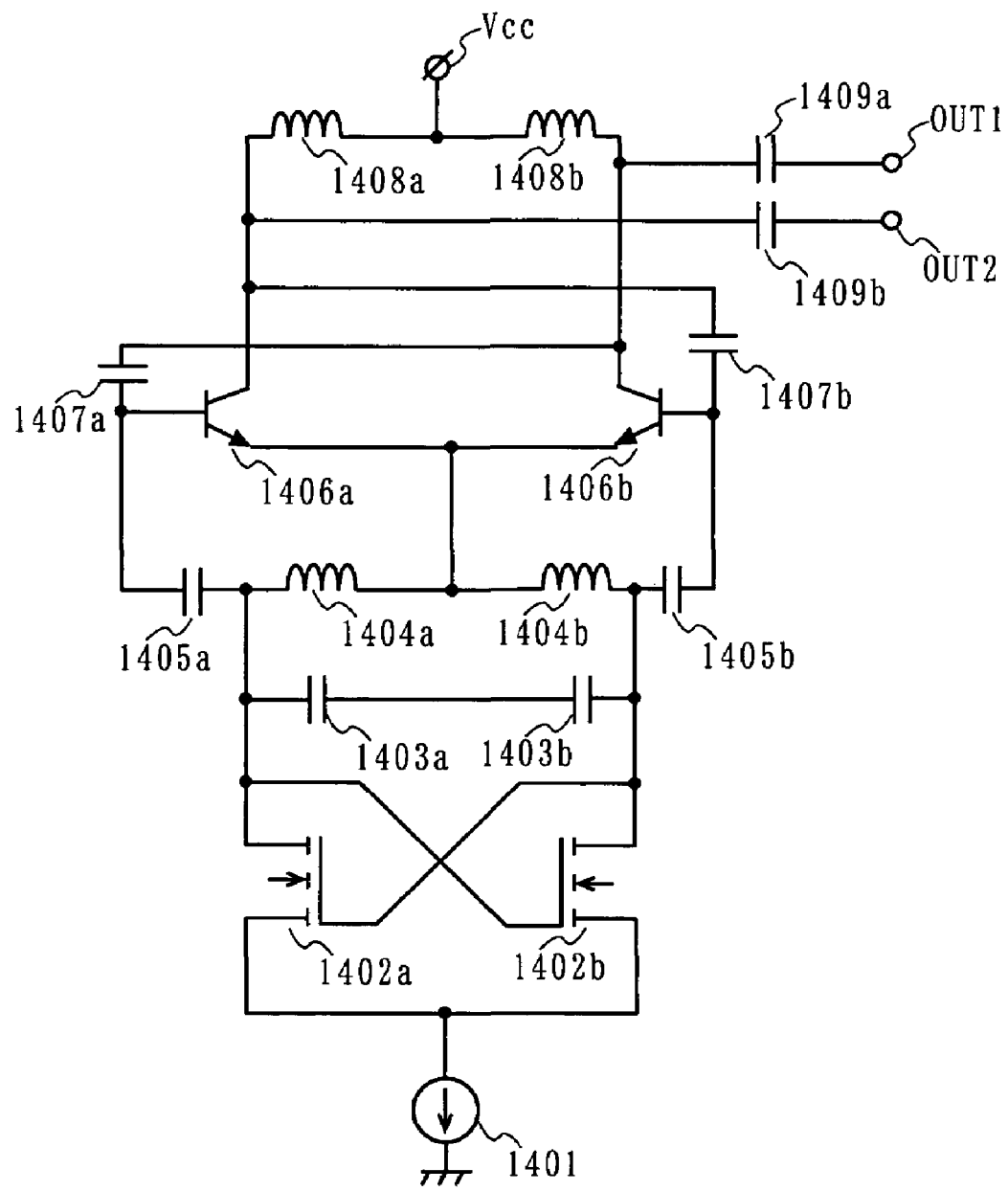
FIG. 19 is a circuit diagram of a differential oscillator according to a seventh embodiment of the present invention.

FIG. 19 is a circuit diagram of a differential oscillator according to a seventh embodiment of the present invention. In FIG. 19, the differential oscillator includes a constant-current supply 1401, FETs 1402a and 1402b, capacitors 1403a and 1403b, inductors 1404a and 1404b, capacitors 1405a and 1405b, transistors 1406a and 1406b, feedback capacitors 1407a and 1407b, inductors 1408a and 1408b, and capacitors 1409a and 1409b.

A signal generated by the FET 1402a is inputted into the base of the transistor 1406a via the capacitor 1405a. Similarly, a signal generated by the FET 1402b is inputted into the base of the transistor 1406b via the capacitor 1405b. A signal outputted from the collector of the transistor 1406a flows through the capacitor 1409a to the output terminal OUT1. Similarly, a signal outputted from the collector of the transistor 1406b flows through the capacitor 1409b to the output terminal OUT2.

In the circuit structure shown in FIG. 19, differential disturbing signals inputted from the output terminals OUT1 and OUT2 are fed back by parasitic capacitances of the transistors 1406a and 1406b. However, components in reverse phase contained in the differential disturbing signals are canceled by the actions of the feedback capacitors 1407a and 1407b. Accordingly, it is possible to prevent the differential disturbing signals from leaking into the FETs 1402a and 1402b, whereby it is possible to prevent deterioration of the noise characteristic of the differential oscillator.

Figure 20:
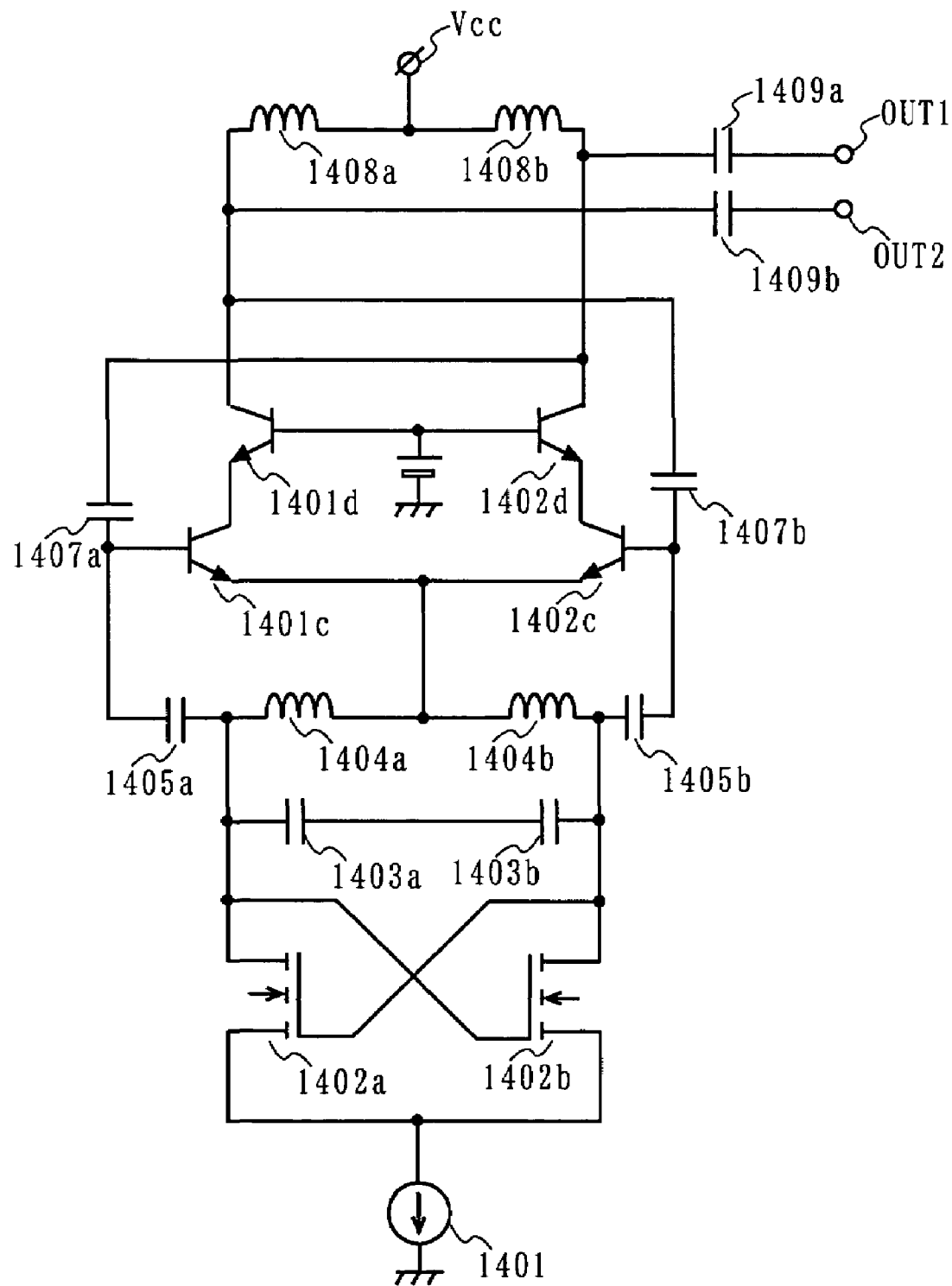
FIG. 20 is a diagram illustrating a structure of a differential oscillator including cascode amplifiers.
Figure 21:
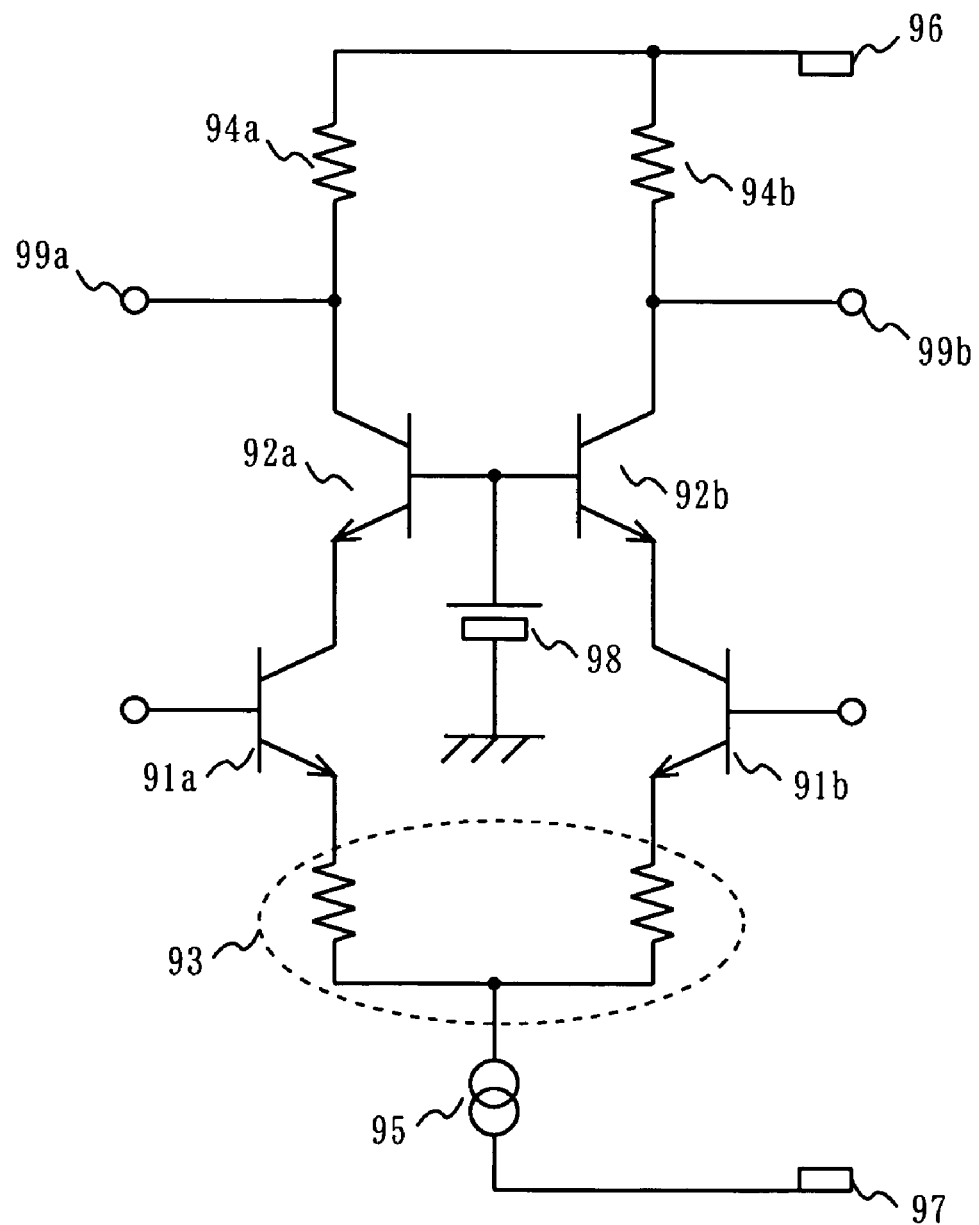
FIG. 21 is a circuit diagram of a conventional differential amplifier including cascode amplifiers.

Note that transistor connections for realizing an amplification function are not limited to those shown in FIG. 19. FIG. 20 is a diagram illustrating a structure of a differential oscillator including cascode amplifiers. In FIG. 20, elements similar to those shown in FIG. 19 are denoted by the same reference numerals. As is apparent from FIG. 20, cascode-connected transistors 1401c and 1401d, and cascode-connected 1402c and 1402d are used. A base of the transistor 1401c is connected to a collector of the transistor 1402d via the feedback capacitor 1407a, and a base of the transistor 1402c is connected to a collector of the transistor 1401d via the feedback capacitor 1407b. This causes differential disturbing signals inputted from the output terminals OUT1 and OUT2 to be fed back via parasitic capacitances of the transistors 1401c, 1401d, 1402c, and 1402d. However, components in reverse phase contained in the differential disturbing signals are canceled by the actions of the feedback capacitors 1407a and 1407b. Accordingly, it is possible to prevent the disturbing signals from leaking into the transistors 1402a and 1402b, whereby it is possible to prevent deterioration of the noise characteristic of the differential oscillator. Moreover, by employing the circuit structure shown in FIG. 20, it is possible to reduce the capacitances of the feedback capacitors, and therefore it is possible to reduce a footprint of the differential oscillator.

Note that the differential oscillator as described above can be used as the oscillator 1209 shown in FIG. 13 or 14 or can be used as the oscillator 1219 shown in FIG. 15 or 16.

Note that the differential amplifier, the differential mixer, and the differential oscillator, which are described in the first through third, sixth, and seventh embodiments, have a commonality of including a high frequency differential circuit which includes: a differential amplification circuit for amplifying a difference in potential between two input signals in reverse phase with each other, which are inputted into first and second input terminals, and for outputting two output signals in reverse phase with each other from first and second output terminals; a first passive element circuit connected between the first input terminal and the second output terminal; and a second passive element circuit connected between the second input terminal and the first output terminal. Such a high frequency differential circuit has a high reverse isolation characteristic.

As described above, the present invention provides a high frequency differential circuit, a differential amplifier, a differential mixer, a differential oscillator, and a radio circuit using the same all of which have a satisfactory reverse isolation characteristic and are advantageous when used in the field of radio communication, for example.

While the invention has been described in detail, the foregoing description is in all aspects illustrative and not restrictive. It is understood that numerous other modifications and variations can be devised without departing from the scope of the invention.

What is claimed is:

1. A high frequency differential circuit which operates in accordance with a difference in potential between two signals, the circuit comprising:

a differential amplification circuit operable to amplify a difference in potential between a first input signal and a second input signal, the first input signal and the second input signal being in reverse phase with each other, the first input signal being input into an input end of a first active element, the second input signal being input into an input end of a second active element, the first and second active elements being differentially connected to each other, and the differential amplification circuit being operable to output a first output signal from an output end of the first active element and a second output signal from an output end of the second active element;

a first passive element circuit connected between the input end of the first active element and the output end of the second active element; and a second passive element circuit connected between the input end of the second active element and the output end of the first active element, wherein an impedance of the first passive element circuit is set so as to transfer a signal having a sufficient intensity to cancel a feedback signal fed back from the output end of the first active element to the input end of the first active element, and wherein an impedance of the second passive element circuit is set so as to transfer a signal having a sufficient intensity to cancel a feedback signal fed back from the output end of the second active element to the input end of the second active element.

2. The high frequency differential circuit according to claim 1, wherein the differential amplification circuit includes two cascode amplifiers.

3. The high frequency differential circuit according to claim 1, wherein the first and second passive element circuits are capacitors.

4. The high frequency differential circuit according to claim 3, wherein a capacitance of each capacitor is set so as to transfer a positive phase signal having a sufficient intensity to cancel a feedback signal which occurs due to a parasitic capacitance present between an input and an output of a transistor included in the differential amplification circuit.

5. The high frequency differential circuit according to claim 3, wherein a capacitance of each capacitor is equivalent to a parasitic capacitance present between an input and an output of a transistor included in the differential amplification circuit.

6. The high frequency differential circuit according to claim 1, wherein the first passive element circuit is equivalent to an equivalent circuit formed by parasitic components present between the input end of the first active element and the output end of the first active element, and wherein the second passive element circuit is equivalent to an equivalent circuit formed by parasitic components present between the input end of the second active element and the output end of the second active element.

7. The high frequency differential circuit according to claim 1,
wherein the first passive element circuit is equivalent to a portion of an equivalent circuit formed by parasitic components present between the input end of the first active element and the output end of the first active element, and
wherein the second passive element circuit is equivalent to a portion of an equivalent circuit formed by parasitic components present between the input end of the second active element and the output end of the second active element.

8. The high frequency differential circuit according to claim 1, further comprising a third passive element circuit connected between the first and second passive element circuits.

9. The high frequency differential circuit according to claim 8, wherein in comparison with an impedance between an input and an output of the high frequency differential circuit an impedance of the third passive element circuit is high in a predetermined frequency band and low in other frequency bands.

10. The high frequency differential circuit according to claim 8, wherein the third passive element circuit is a parallel circuit in which an inductor and a capacitor are connected in parallel.

11. The high frequency differential circuit according to claim 1,
wherein the differential amplification circuit includes first, second, third, and fourth transistors,
wherein an emitter of the first transistor is connected to an emitter of the second transistor,
wherein a collector of the first transistor is connected to en emitter of the third transistor,
wherein a base of the third transistor is connected to a base of the fourth transistor,
wherein a collector of the second transistor is connected to an emitter of the fourth transistor,
wherein the first passive element circuit includes a first capacitor provided between a base of the first transistor and a collector of the fourth transistor, and
wherein the second passive element circuit includes a second capacitor provided between a base of the second transistor and a collector of the third transistor.

12. The high frequency differential circuit according to claim 1,
wherein the differential amplification circuit includes first and second transistors,
wherein a base of the first transistor is connected to a base of the second transistor,
wherein the first passive element circuit includes a first capacitor provided between an emitter of the first transistor and a collector of the second transistor, and
wherein the second passive element circuit includes a second capacitor provided between an emitter of the second transistor and a collector of the first transistor.

13. The high frequency differential circuit according to claim 1, further comprising:
a first pair of transistors having their emitters connected to the output end of the first active element; and
a second pair of transistors having their emitters connected to the output end of the the second active element wherein the high frequency differential circuit operates as a differential mixer.

14. The high frequency differential circuit according to claim 13,
wherein the differential amplification circuit includes first and second transistors having their emitters connected together,
wherein the first pair of transistors is made by third and fourth transistors having their emitters connected together,
wherein the second pair of transistors is made by fifth and sixth transistors having their emitters connected together,
wherein a collector of the first transistor is connected to the emitters of the third and fourth transistors,
wherein a collector of the second transistor is connected to the emitters of the fifth and sixth transistors,
wherein bases of the third and sixth transistors are connected together,
wherein bases of the fourth and fifth transistors are connected together,
wherein collectors of the third and fifth transistors are connected together,
wherein collectors of the fourth and sixth transistors are connected together,
wherein the first passive element circuit includes a first capacitor provided between the collector of the first transistor and a base of the second transistor, and
wherein the second passive element circuit includes a second capacitor provided between the collector of the second transistor and a base of the first transistor.

15. The high frequency differential circuit according to claim 13,
wherein the differential amplification circuit includes first, second, third, and fourth transistors,
wherein the first pair of transistors is made by fifth and sixth transistors having their emitters connected together,
wherein the second pair of transistors is made by seventh and eighth transistors having their emitters connected together,
wherein the emitter of the first transistor is connected to the emitter of the second transistor,
wherein a collector of the first transistor is connected to an emitter of the third transistor,
wherein a base of the third transistor is connected to a base of the fourth transistor,
wherein a collector of the second transistor is connected to an emitter of the fourth transistor,
wherein a collector of the third transistor is connected to the emitters of the fifth and sixth transistors,
wherein a collector of the fourth transistor is connected to the emitters of the seventh and eighth transistors,
wherein bases of the fifth and eighth transistors are connected together,
wherein bases of the sixth and seventh transistors are connected together,
wherein collectors of the fifth and seventh transistors are connected together,
wherein collectors of the sixth and eighth transistors are connected together,
wherein the first passive element circuit includes a first capacitor provided between a base of the first transistor and the collector of the fourth transistor, and
wherein the second passive element circuit includes a second capacitor provided between a base of the second transistor and the collector of the third transistor.

16. The high frequency differential circuit according to claim 1, further comprising a differential oscillation circuit connected between the input end of the first active element and the input end of the second active element the differential oscillation circuit being connected to the input end of the first active element via a first capacitor and to the input end of the second active element via a second capacitor, wherein the high frequency differential circuit operates as a differential oscillator.

17. The high frequency differential circuit according to claim 16,
wherein the differential amplification circuit includes first and second transistors having their emitters connected together,
wherein die differential oscillation circuit includes a first FET, a second FET, a third capacitor, a fourth capacitor, a first inductor, and a second inductor,
wherein a drain of the first FET is connected to a gate of the second FET,
wherein a drain of the second FET is connected to a gate of the first FET,
wherein the second and third capacitors are connected in series between the drains of the first and second FETs,
wherein the first and second inductors are connected in series between the drains of the first and second FETs,
wherein the drain of the first FET is connected to a base of the first transistor via the first capacitor,
wherein the drain of the second FET is connected to a base of the second transistor via the second capacitor,
wherein the first passive element circuit includes a fifth capacitor provided between a collector of the first transistor and the base of the second transistor, and
wherein the second passive element circuit includes a sixth capacitor provided between a collector of the second transistor and the base of the first transistor.

18. The high frequency differential circuit according to claim 16,
wherein the differential amplification circuit includes first, second, third, and fourth transistors,
wherein the differential oscillation circuit includes a first FET, a second FET, a third capacitor, a fourth capacitor, a first inductor, and a second inductor,
wherein a drain of the first FET is connected to a gate of the second FET,
wherein a drain of the second FET is connected to a gate of the first FET,
wherein the second and third capacitors are connected in series between the drains of the first and second FETs,
wherein the first and second inductors are connected in series between the drains of the first and second FETs,
wherein the drain of the first FET is connected to a base of the first transistor via the first capacitor,
wherein the drain of the second FET is connected to a base of the second transistor via the second capacitor,
wherein an emitter of the first transistor is connected to an emitter of the second transistor,
wherein a collector of the first transistor is connected to an emitter of the third transistor,
wherein a base of the third transistor is connected to a base of the fourth transistor,
wherein a collector of the second transistor is connected to an emitter of the fourth transistor,
wherein the first passive element circuit includes a fifth capacitor provided between the base of the first transistor and a collector of the fourth transistor, and
wherein the second passive element circuit includes a sixth capacitor provided between the base of the second transistor and a collector of the third transistor.

19. A radio circuit for transmitting and receiving a radio signal, comprising an amplifier, a mixer, and an oscillator,
wherein at least one of the amplifier, the mixer, and the oscillator includes:
a differential amplification circuit operable to amplify a difference in potential between a first input signal and a second input signal, the first input signal and the second input signal being in reverse phase with each other, the first input signal being input into an input end of a first active element, the second input signal being input into an input end of a second active element the first and second active elements being differentially connected to each other, and the differential amplification circuit being operable to output a first output signal from an output end of the first active element and a second output signal from an output end of the second active element;
a first passive element circuit connected between the input end of the first active element and the output end of the second active element; and
a second passive element circuit connected between the input end of the second active element and the output end of the first active element,
wherein an impedance of the first passive element circuit is set so as to transfer a signal having a sufficient intensity to cancel a feedback signal fed back from the output end of the first active element to the input end of the first active element, and
wherein an impedance of the second passive element circuit is set so as to transfer a signal having a sufficient intensity to cancel a feedback signal fed back from the output end of the second active element to the input end of the second active element.

20. The radio circuit according to claim 19,
wherein the amplifier amplifies a reception signal received by an antenna,
wherein the oscillator oscillates a local signal,
wherein the mixer uses the local signal outputted from the oscillator to downconvert the reception signal amplified by the amplifier, and
wherein the amplifier includes the high frequency differential circuit.

21. The radio circuit according to claim 19,
wherein the oscillator oscillates a local signal,
wherein the amplifier amplifies the local signal outputted from the oscillator,
wherein the mixer uses the local signal amplified by the amplifier to downconvert a reception signal received by an antenna, and
wherein the amplifier includes the high frequency differential circuit.

22. The radio circuit according to claim 19,
wherein the oscillator Oscillates a local signal,
wherein the amplifier amplifies the local signal outputted from the oscillator,
wherein the mixer uses the local signal amplified by the amplifier to upconvert an IF signal, and
wherein the amplifier includes the high frequency differential circuit.

23. The radio circuit according to claim 19,
wherein the oscillator oscillates a local signal,
wherein the mixer uses the local signal outputted from the oscillator to upconvert the IF signal into an RF signal, and
wherein the amplifier amplifies the RF signal outputted from the mixer, and includes the high frequency differential circuit.

24. The radio circuit according to claim 19,
wherein the amplifier amplifies a reception signal received by an antenna,
wherein the oscillator oscillates a local signal, and
wherein the mixer uses the local signal outputted from the oscillator to downconvert the reception signal amplified by the amplifier, and includes the high frequency differential circuit.

25. The radio circuit according to claim 19,
wherein the amplifier amplifies a reception signal received by an antenna,
wherein the oscillator oscillates a local signal,
wherein the mixer uses the local signal outputted from the oscillator to downconvert the reception signal amplified by the amplifier, and
wherein the oscillator includes the high frequency differential circuit.

26. The radio circuit according to claim 19,
wherein the oscillator oscillates a local signal,
wherein the mixer uses the local signal outputted from the oscillator to upconvert an IF signal into an RF signal,
wherein the amplifier amplifies the RF signal outputted from the mixer, and
wherein the mixer includes the high frequency differential circuit.

27. The radio circuit according to claim 19,
wherein the oscillator oscillates a local signal,
wherein the mixer uses the local signal outputted from the oscillator to upconvert an IF signal into an RF signal,
wherein the amplifier amplifies the RF signal outputted from the mixer, and
wherein the oscillator includes the high frequency differential circuit.

* * * * *

UNITED STATES PATENT AND TRADEMARK OFFICE
CERTIFICATE OF CORRECTION

PATENT NO. : 7,109,793 B2  Page 1 of 1
APPLICATION NO. : 10/848212
DATED : September 19, 2006
INVENTOR(S) : Toshifumi Nakatani et al.

It is certified that error appears in the above-identified patent and that said Letters Patent is hereby corrected as shown below:

Title Page,

Item [57], Abstract, line 2, "RE" should read --RF--.

Item [57], Abstract, line 10, "Port and Port4" should read --Port1 and Port4--.

Column 21,

Line 23, "circuit an impedance" should read --circuit, an impedance--;

Line 67, "element" should read --element,--.

Column 23,

Line 4, "active element the" should read --active element, the--;

Line 15, "wherein die differential" should read --wherein the differential--.

Column 24,

Line 15, "active element the" should read --active element, the--;

Line 57, "the oscillator Oscillates" should read --the oscillator oscillates--.

Signed and Sealed this

Thirtieth Day of January, 2007

JON W. DUDAS
*Director of the United States Patent and Trademark Office*